(12) United States Patent
Ishitani et al.

(10) Patent No.: US 10,854,679 B2
(45) Date of Patent: Dec. 1, 2020

(54) LIGHT-EMITTING DEVICE, LIGHT-EMITTING PANEL, AND DISPLAY PANEL

(71) Applicant: Semiconductor Energy Laboratory Co., Ltd., Kanagawa-ken (JP)

(72) Inventors: Tetsuji Ishitani, Kanagawa (JP); Masaru Nakano, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 125 days.

(21) Appl. No.: 14/272,904

(22) Filed: May 8, 2014

(65) Prior Publication Data

US 2014/0334143 A1    Nov. 13, 2014

(30) Foreign Application Priority Data

May 10, 2013    (JP) .................................. 2013-100023

(51) Int. Cl.
| | | |
|---|---|---|
| *F21V 9/08* | (2018.01) | |
| *F21V 13/08* | (2006.01) | |
| *H01L 27/32* | (2006.01) | |
| *H01L 51/52* | (2006.01) | |
| *H01L 51/00* | (2006.01) | |

(52) U.S. Cl.
CPC ...... *H01L 27/3206* (2013.01); *H01L 51/5284* (2013.01); *H01L 27/322* (2013.01); *H01L 51/006* (2013.01); *H01L 51/0072* (2013.01); *H01L 51/0074* (2013.01); *H01L 51/0085* (2013.01); *H01L 51/5265* (2013.01)

(58) Field of Classification Search
CPC .............. H01L 27/322; H01L 27/3206; H01L 27/3211; H01L 27/3209; G02B 5/223; G02B 5/22; G02B 5/23; G02F 1/133514; G02F 1/133519
See application file for complete search history.

(56) References Cited

U.S. PATENT DOCUMENTS

| | | | |
|---|---|---|---|
| 5,652,600 A * | 7/1997 | Khormaei ................ | G09G 3/30 345/76 |
| 6,737,800 B1 * | 5/2004 | Winters .................. | C09K 11/06 313/113 |
| 7,531,847 B2 | 5/2009 | Shitagaki et al. | |
| 8,017,422 B2 | 9/2011 | Fujii et al. | |

(Continued)

FOREIGN PATENT DOCUMENTS

| | | |
|---|---|---|
| EP | 1 895 335 A1 | 3/2008 |
| JP | 2008-525993 | 7/2008 |

(Continued)

*Primary Examiner* — John A Bodnar
(74) *Attorney, Agent, or Firm* — Husch Blackwell LLP

(57) ABSTRACT

A novel light-emitting device or light-emitting panel in which reflected external light is reduced is provided. A novel display panel in which reflected external light is reduced is provided. The present inventors have conceived a light-emitting device including a light-emitting module that emits light with a spectrum having a peak at one wavelength in a visible light region and an absorption layer that absorbs part of light with wavelengths shorter than the one wavelength and part of light with wavelengths longer than the one wavelength more easily than light with the one wavelength.

15 Claims, 10 Drawing Sheets
(1 of 10 Drawing Sheet(s) Filed in Color)

(56) References Cited

U.S. PATENT DOCUMENTS

| | | |
|---|---|---|
| 8,389,988 B2 | 3/2013 | Yamazaki et al. |
| 8,501,843 B2 | 8/2013 | Ishida et al. |
| 8,569,948 B2 | 10/2013 | Wolk et al. |
| 8,633,473 B2 | 1/2014 | Noda et al. |
| 9,153,627 B2 | 10/2015 | Ohsawa et al. |
| 9,231,154 B2 | 1/2016 | Ikeda et al. |
| 9,673,264 B2 | 6/2017 | Ohsawa et al. |
| 9,918,370 B2 | 3/2018 | Wolk et al. |
| 2003/0107314 A1* | 6/2003 | Urabe ............... H01L 27/322 313/506 |
| 2005/0249972 A1* | 11/2005 | Hatwar ............ H01L 51/5265 428/690 |
| 2006/0138945 A1* | 6/2006 | Wolk ............... H01L 27/3211 313/506 |
| 2007/0194679 A1* | 8/2007 | Jo ..................... H01J 11/10 313/112 |
| 2007/0210703 A1* | 9/2007 | Izzanni ............. H01L 27/322 313/504 |
| 2008/0125524 A1* | 5/2008 | Ishida ................. G02B 5/223 524/104 |
| 2010/0090595 A1* | 4/2010 | Nomura ........... B29D 11/00596 313/506 |
| 2010/0117999 A1* | 5/2010 | Matsunaga ........ H01L 29/7869 345/204 |
| 2011/0228510 A1* | 9/2011 | Park .................... G02B 5/23 362/19 |
| 2012/0168787 A1* | 7/2012 | Okumoto ........... H01L 27/3211 257/89 |
| 2013/0009194 A1 | 1/2013 | Yamazaki et al. |
| 2014/0284642 A1 | 9/2014 | Yamazaki et al. |
| 2014/0306201 A1 | 10/2014 | Yamazaki et al. |
| 2017/0271414 A1 | 9/2017 | Ohsawa et al. |

FOREIGN PATENT DOCUMENTS

| | | |
|---|---|---|
| JP | 2008-276212 A | 11/2008 |
| JP | 2012-199231 A | 10/2012 |
| JP | 2012-248432 A | 12/2012 |
| JP | 2012-252963 A | 12/2012 |
| JP | 2013-38069 | 2/2013 |
| JP | 2014-013684 A | 1/2014 |
| JP | 2014-154390 A | 8/2014 |
| WO | WO 2006/071913 A2 | 7/2006 |
| WO | WO 2006/137272 A1 | 12/2006 |
| WO | WO 2008/126884 A1 | 10/2008 |

* cited by examiner

FIG. 1A1
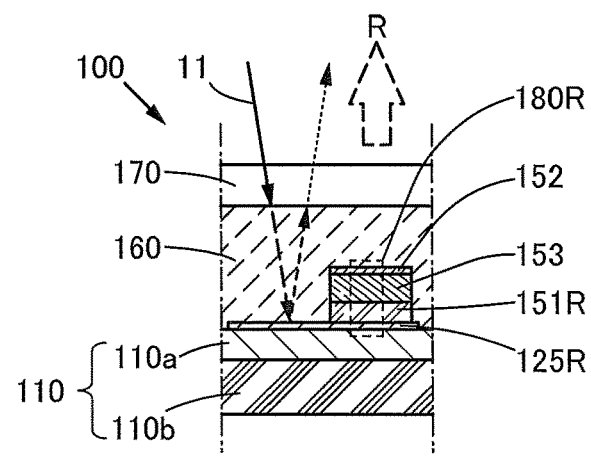
FIG. 1A2
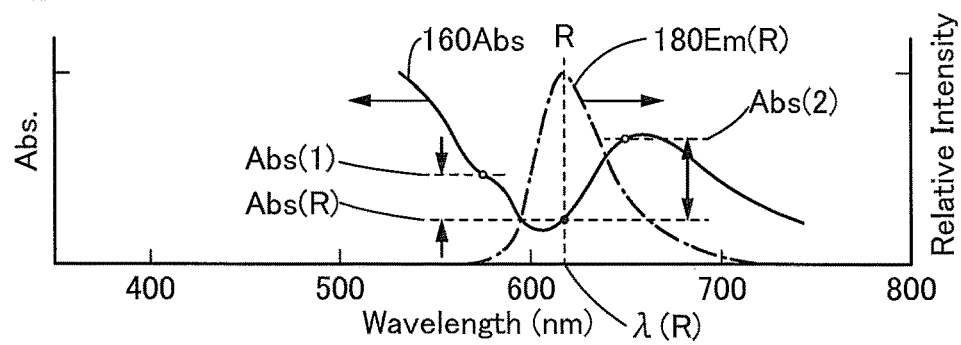
FIG. 1B1
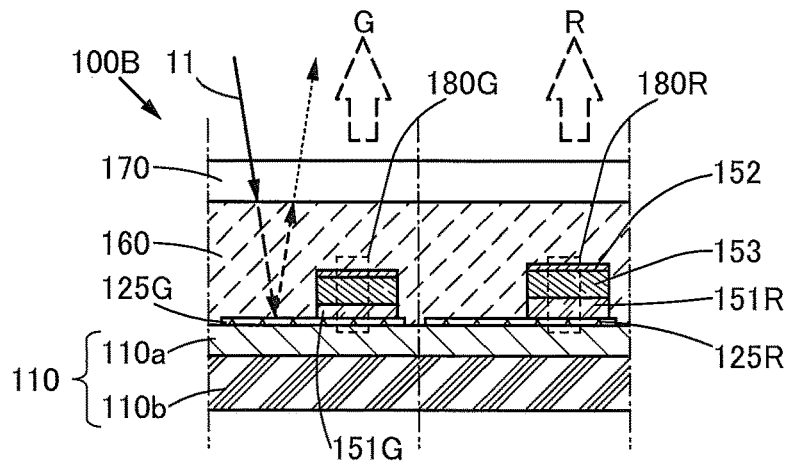
FIG. 1B2
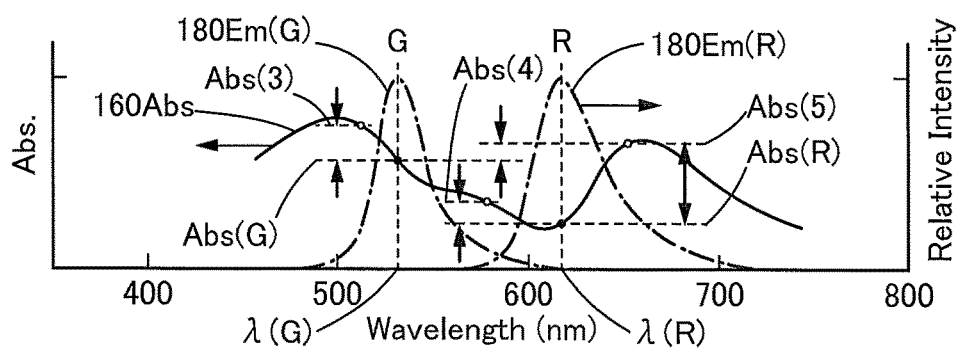

FIG. 9A1
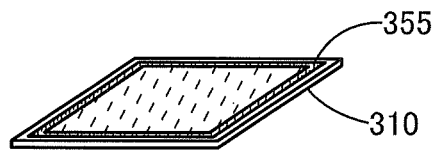
FIG. 9A2
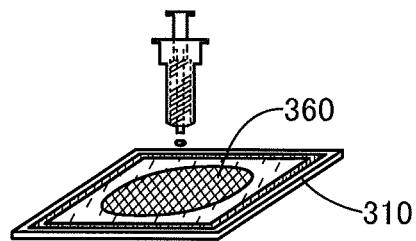
FIG. 9A3
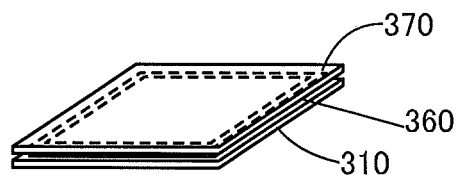
FIG. 9B
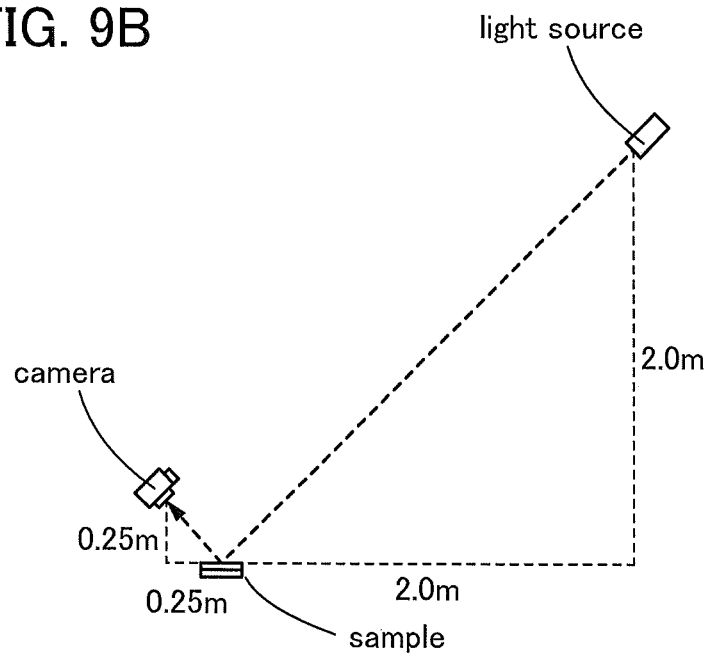

LIGHT-EMITTING DEVICE, LIGHT-EMITTING PANEL, AND DISPLAY PANEL

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a light-emitting device, a light-emitting panel, or a display panel.

2. Description of the Related Art

A structure including, between a first substrate and a second substrate, a first electrode provided over the first substrate, a second electrode provided over the first electrode with a layer containing a light-emitting organic compound provided therebetween, and a sacrifice layer formed using a liquid material and provided over the second electrode is known (Patent Document 1).

REFERENCE

Patent Document

[Patent Document 1] Japanese Published Patent Application No. 2013-38069

SUMMARY OF THE INVENTION

An object of one embodiment of the present invention is to provide a novel light-emitting device or light-emitting panel in which reflected external light is reduced. Another object of one embodiment of the present invention is to provide a novel display panel in which reflected external light is reduced.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including an absorption layer, a conductive film overlapped with the absorption layer, and a light-emitting module electrically connected to the conductive film. The conductive film reflects visible light. The light-emitting module emits, toward the absorption layer, light with a spectrum having a peak at one wavelength in a visible light region. The absorption layer absorbs part of light with wavelengths shorter than the one wavelength and part of light with wavelengths longer than the one wavelength more easily than light with the one wavelength.

Another embodiment of the present invention is a light-emitting panel including an absorption layer, a first conductive film and a second conductive film that are overlapped with the absorption layer, a first light-emitting module electrically connected to the first conductive film, and a second light-emitting module electrically connected to the second conductive film. The first conductive film and the second conductive film reflect visible light. The first light-emitting module emits, toward the absorption layer, light with a spectrum having a peak at a first wavelength in a visible light region. The second light-emitting module emits, toward the absorption layer, light with a spectrum having a peak at a second wavelength that is different from the first wavelength in the visible light region. The absorption layer absorbs part of light with wavelengths shorter than the first wavelength and part of light with wavelengths longer than the first wavelength more easily than light with the first wavelength, and absorbs part of light with wavelengths shorter than the second wavelength and part of light with wavelengths longer than the second wavelength more easily than light with the second wavelength.

The light-emitting panel of one embodiment of the present invention includes a light-emitting module that emits light with a spectrum having a peak at one wavelength in a visible light region and an absorption layer that absorbs part of light with wavelengths shorter than the one wavelength and part of light with wavelengths longer than the one wavelength more easily than light with the one wavelength.

Thus, part of external light that enters from the outside of the light-emitting panel and passes through the absorption layer toward the reflective conductive film can be absorbed by the absorption layer before reaching the reflective conductive film. Further, part of light that is reflected by the reflective conductive film can be absorbed by the absorption layer before being emitted through the absorption layer. Consequently, the intensity of external light reflected by the reflective conductive film can be reduced.

As a result, a phenomenon in which a user of a light-emitting device cannot distinguish between light emitted by a light-emitting module and reflected external light is unlikely to occur.

Another embodiment of the present invention is a display panel including an absorption layer, first to third conductive films overlapped with the absorption layer, a first light-emitting module electrically connected to the first conductive film, a second light-emitting module electrically connected to the second conductive film, and a third light-emitting module electrically connected to the third conductive film. The first to third conductive films reflect visible light. The first light-emitting module emits, toward the absorption layer, light with a spectrum having a peak at a first wavelength in a visible light region. The second light-emitting module emits, toward the absorption layer, light with a spectrum having a peak at a second wavelength that is different from the first wavelength in the visible light region. The third light-emitting module emits, toward the absorption layer, light with a spectrum having a peak at a third wavelength that is different from the first wavelength and the second wavelength in the visible light region. The absorption layer absorbs part of light with wavelengths shorter than the first wavelength and part of light with wavelengths longer than the first wavelength more easily than light with the first wavelength, absorbs part of light with wavelengths shorter than the second wavelength and part of light with wavelengths longer than the second wavelength more easily than light with the second wavelength, and absorbs part of light with wavelengths shorter than the third wavelength and part of light with wavelengths longer than the third wavelength more easily than light with the third wavelength.

In the display panel of one embodiment of the present invention, the absorption layer absorbs part of light with wavelengths between the first wavelength and the second wavelength more easily than light with the first wavelength and light with the second wavelength.

The display panel of one embodiment of the present invention includes an absorption layer that absorbs part of light with wavelengths shorter than the first wavelength and part of light with wavelengths longer than the first wavelength more easily than light with the first wavelength, absorbs part of light with wavelengths shorter than the second wavelength and part of light with wavelengths longer than the second wavelength more easily than light with the second wavelength, and absorbs part of light with wavelengths between the first wavelength and the second wavelength more easily than light with the first wavelength and light with the second wavelength.

With this structure, it is possible to provide a novel display panel in which lowering of display contrast under strong external light can be prevented. It is also possible to provide a novel display panel in which a problem (e.g., perception of a pattern of interference fringes) that is attributed to interference between light reflected by light-emitting modules in regularly arranged structures (e.g., sub-pixels) can be prevented.

In the display panel of one embodiment of the present invention, a half width of the spectrum having a peak at the first wavelength is greater than or equal to 15 nm and less than or equal to 35 nm and a half width of the spectrum having a peak at the second wavelength is greater than or equal to 15 nm and less than or equal to 95 nm.

In the display panel of one embodiment of the present invention, the first light-emitting module and the second light-emitting module each include a microresonator structure.

The display panel of one embodiment of the present invention includes a light-emitting module that emits visible light with a spectrum having a narrow half width. Thus, light emitted by the light-emitting module can be prevented from being absorbed by an absorption layer. Consequently, it is possible to provide a novel display panel in which light emitted by a light-emitting module can be extracted efficiently.

In the display panel of one embodiment of the present invention, the first conductive films and the first light-emitting modules electrically connected to the first conductive films are arranged with a resolution of greater than or equal to 200 ppi and less than or equal to 1000 ppi. Note that ppi (pixels per inch) is a unit that represents the appearance frequency of pixels per inch. When three sub-pixels form one pixel, for example, the three sub-pixels are counted as one repeating unit.

The display panel of one embodiment of the present invention includes an absorption layer capable of absorbing light reflected by conductive films that are electrically connected to light-emitting modules arranged with high spatial frequency. This structure not only enables display of excellent high-resolution images but also makes interference between light reflected by the conductive films unlikely to occur. Consequently, it is possible to provide a novel display panel in which undesired light generated by interference (e.g., a pattern of interference fringes) can be reduced.

In the display panel of one embodiment of the present invention, the absorption layer is in contact with the first light-emitting module, the second light-emitting module, and the third light-emitting module and has a refractive index of greater than or equal to 1.4 and less than or equal to 2.0.

Thus, light emitted by the light-emitting module efficiently enters the absorption layer. Consequently, it is possible to provide a novel display panel in which light emitted by a light-emitting module can be extracted efficiently.

Note that in this specification, an "EL layer" refers to a layer provided between a pair of electrodes in a light-emitting element. Thus, a light-emitting layer containing an organic compound that is a light-emitting substance, which is interposed between electrodes, is one embodiment of the EL layer.

In this specification, in the case where a substance A is dispersed in matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

According to one embodiment of the present invention, a novel light-emitting device or light-emitting panel in which reflected external light is reduced can be provided. A novel display panel in which reflected external light is reduced can also be provided.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A1, 1A2, 1B1, and 1B2 illustrate light-emitting devices according to an embodiment.

FIGS. 9A1, 9A2, 9A3, and 9B show a method for forming an absorption layer and a method for evaluating reflection of external light according to an example.

DETAILED DESCRIPTION OF THE INVENTION

Figure 2A:
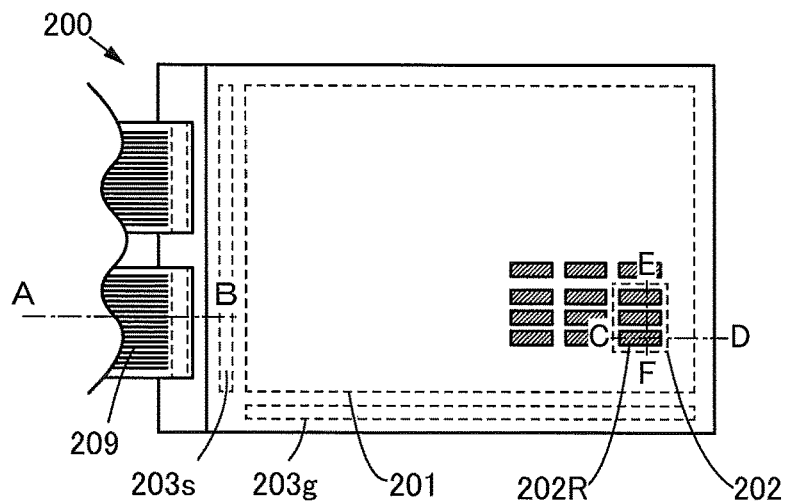
FIGS. 2A to 2C illustrate a display panel according to an embodiment.

<Example of Problem Solvable by One Embodiment of the Present Invention>

A light-emitting module including a light-emitting element and an optical element, a light-emitting device including a light-emitting module, and a display panel including a plurality of light-emitting modules are known. Such a light-emitting device includes a conductive film that can supply power and signals for driving a light-emitting module.

Metal has lower electrical resistance than those of other substances. Thus, using metal for a wiring for supplying power and signals to the light-emitting module can reduce brightness unevenness and power consumption of the light-emitting device.

Further, using metal for the conductive film makes the conductive film significantly reflect light that enters from the outside of the light-emitting device toward the conductive film. Thus, a phenomenon in which a user of a light-emitting device cannot distinguish between light emitted by a light-emitting module and reflected external light occurs.

For example, when the display panel is used under strong external light, the contrast of display on the display panel lowers because of the above phenomenon.

A display panel using a light-emitting device includes a light-emitting module in a sub-pixel. Sub-pixels are regularly arranged in the display panel. Interference occurs between light reflected by regularly arranged structures such as sub-pixels. Thus, a problem such as perception of undesired light (e.g., a pattern of interference fringes) occurs.

One Embodiment of Present Invention

The embodiments described below include one embodiment of the present invention which is made with a focus on the wavelength of light that enters a light-emitting device from the outside and the wavelength of light that is emitted by the light-emitting device.

A light-emitting device of one embodiment of the present invention includes a light-emitting module that emits light with a spectrum having a peak at one wavelength in a visible light region and an absorption layer that absorbs part of light with wavelengths shorter than the one wavelength and part of light with wavelengths longer than the one wavelength more easily than light with the one wavelength.

Thus, part of external light that enters from the outside of the light-emitting device and passes through the absorption layer toward a reflective conductive film can be absorbed by the absorption layer before reaching the conductive film. Further, part of light that is reflected by the conductive film can be absorbed by the absorption layer before being emitted outside through the absorption layer. Consequently, the intensity of external light reflected by the reflective conductive film can be reduced.

As a result, a phenomenon in which a user of a light-emitting device cannot distinguish between light emitted by a light-emitting module and reflected external light is unlikely to occur.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a structure of a light-emitting device of one embodiment of the present invention is described with reference to FIGS. 1A1 and 1A2.

FIG. 1A1 is a schematic cross-sectional view of a light-emitting device 100 of one embodiment of the present invention. FIG. 1A2 shows an absorption spectrum and an emission spectrum of an absorption layer 160 and a first light-emitting module 180R, respectively, included in the light-emitting device 100. In FIG. 1A2, the horizontal axis, the left vertical axis, and the right vertical axis represent, respectively, the wavelength of light, absorption (also referred to as absorbance), and the relative intensity of light.

The light-emitting device described in this embodiment includes the absorption layer 160, a first conductive film 125R overlapped with the absorption layer 160, and the first light-emitting module 180R electrically connected to the first conductive film 125R (see FIG. 1A1). Note that the first light-emitting module 180R emits light in the direction indicated by arrow R in the drawing. The solid line arrow and broken line arrows schematically show the path of external light 11 entering the light-emitting device 100 and being reflected by the first conductive film 125R.

The first conductive film 125R reflects visible light.

The first light-emitting module 180R emits light with a spectrum 180Em(R) having a peak at a wavelength $\lambda(R)$ in a visible light region toward the absorption layer 160. Note that the dashed-dotted line in FIG. 1A2 represents the spectrum 180Em(R).

The absorption layer 160 absorbs part of light with wavelengths shorter than the wavelength $\lambda(R)$ and part of light with wavelengths longer than the wavelength $\lambda(R)$ more easily than light with the wavelength $\lambda(R)$.

For example, an absorption spectrum 160Abs of the absorption layer 160 exhibits an absorption Abs(R) at the wavelength $\lambda(R)$, an absorption Abs(1) higher than the absorption Abs(R) at a wavelength shorter than the wavelength $\lambda(R)$, and an absorption Abs(2) higher than the absorption Abs(R) at a wavelength longer than the wavelength $\lambda(R)$.

Thus, part of the external light 11 that enters from the outside of the light-emitting device 100 and passes through the absorption layer 160 toward the first reflective conductive film 125R can be absorbed by the absorption layer 160 before reaching the first conductive film 125R. Further, part of light that is reflected by the first conductive film 125R can be absorbed by the absorption layer 160 before being emitted outside through the absorption layer 160. Consequently, the intensity of light derived from the external light 11 that is reflected by the first conductive film 125R to be emitted outside can be reduced.

The absorption layer 160 transmits light with the wavelength $\lambda(R)$ more easily than part of light with wavelengths shorter than the wavelength $\lambda(R)$ and part of light with wavelengths longer than the wavelength $\lambda(R)$. In other words, the absorption layer 160 does not easily absorb light with the wavelength $\lambda(R)$ that is emitted by the first light-emitting module 180R.

As a result, a phenomenon in which a user of the light-emitting device cannot distinguish between light emitted by the first light-emitting module 180R and the reflected external light 11 is unlikely to occur.

The light-emitting device 100 described as an example in this embodiment includes a substrate 110, a counter substrate 170 facing the substrate 110, and the first light-emitting module 180R, the absorption layer 160, and a wiring that supplies power to the first light-emitting module 180R between the substrate 110 and the counter substrate 170. Note that the first light-emitting module 180R and the wiring are provided over the substrate 110, and the absorption layer 160 is provided between the first light-emitting module 180R and the counter substrate 170.

Individual components included in the light-emitting device 100 of one embodiment of the present invention are described below.

<<Light-Emitting Module>>

The first light-emitting module 180R includes a light-emitting element and an optical element. Any of a variety of light-emitting elements such as a light-emitting diode and an electroluminescent element can be used as the light-emitting element.

For example, the light-emitting element described as an example in this embodiment includes a lower electrode 151R, an upper electrode 152 overlapping with the lower electrode 151R, and a layer 153 containing a light-emitting organic compound provided between the lower electrode and the upper electrode.

The lower electrode 151R is provided to overlap with the reflective conductive film 125R and is electrically connected to the conductive film 125R. In other words, the reflective conductive film 125R includes a portion that overlaps with the lower electrode 151R and a portion that is electrically connected to the lower electrode 151R. The portion of the reflective conductive film 125R that overlaps with the lower electrode 151R is included in the first light-emitting module 180R, and the rest of the reflective conductive film 125R includes the wiring. The upper electrode 152 is electrically connected to another wiring (not shown) via a connection portion (not shown). The light-emitting element is supplied with power from the conductive film 125R and the other wiring (not shown).

Note that an example of a light-emitting element that can be used for the light-emitting device described in this embodiment is detailed in Embodiment 3.

Further, an optical element can be provided to overlap with the light-emitting element. Examples of the optical element include a microresonator.

For example, a microresonator is formed using a semi-transmissive and semi-reflective conductive film and a reflective conductive film and a light-emitting element is formed between those films, whereby a light-emitting module can be formed. Specifically, the lower electrode 151R is formed using a light-transmitting conductive film to overlap with the reflective conductive film 125R, and the upper electrode 152 is formed using a semi-transmissive and semi-reflective conductive film.

Note that the thickness of the lower electrode 151R can be changed to adjust the gap between the semi-transmissive and semi-reflective conductive film and the reflective conductive film of the microresonator. By adjusting the gap, the wavelength of light extracted from the microresonator can be controlled. Using the microresonator enables light with a spectrum having a narrow half width to be extracted from the light-emitting module.

<<Substrate>>

A substrate that can be used as the substrate 110 is not particularly limited as long as it has heat resistance high enough to withstand the manufacturing process and thickness and size that allow the substrate to be used in a manufacturing apparatus and it prevents diffusion of unintentional impurities to the light-emitting element.

A substrate in which the amount of diffusion of unintentional impurities is small enough for the substrate to be used as the substrate 110 can be selected on the basis of required gas barrier property, which depends on the light-emitting element used with the substrate 110. Specifically, in the case where an organic electroluminescent element is used as a light-emitting element, a substrate with a vapor permeability of lower than or equal to $10^{-5}$ g/m$^2$·day, preferably lower than or equal to $10^{-6}$ g/m$^2$·day can be used.

The substrate can have a single-layer structure, a stacked-layer structure, or a hybrid structure including a fiber material or a particle material. For example, a film-like structure with a thickness of greater than or equal to 1 µm and less than 200 µm or a plate-like structure with a thickness of greater than or equal to 0.1 mm can be employed.

A substrate having a linear expansion coefficient low enough for the substrate to be used as the substrate 110 can be selected in accordance with the difference in linear expansion coefficient between the substrate and another layer stacked over the substrate, the amount of heat applied in the manufacturing process, and the allowable amount of curl. Specifically, the linear expansion coefficient of the substrate can be lower than or equal to $1\times10^{-3}$/K, preferably lower than or equal to $5\times10^{-5}$/K, further preferably lower than or equal to $1\times10^{-5}$/K.

Examples of a material that can be used for the substrate include glass, ceramics, metal, an inorganic material, and a resin.

Specifically, as glass, non-alkali glass, soda-lime glass, potash glass, crystal glass, or the like can be used.

As a metal, SUS, aluminum, or the like can be used. Note that forming an insulating film on the surface of the metal can make the surface have an insulating property.

As an inorganic material, for example, a metal oxide, a metal nitride, or a metal oxynitride can be used. Specifically, silicon oxide, silicon nitride, silicon oxynitride, alumina, or the like can be used.

As a resin, polyester, polyolefin, polyamide, polyimide, polycarbonate, an acrylic resin, or the like can be used.

The substrate 110 described as an example in this embodiment is a stacked body including a substrate 110b and a barrier film 110a that prevents diffusion of unintentional impurities to the light-emitting element. Specifically, the substrate 110b is a glass substrate and the barrier film 110a is an inorganic film containing silicon and nitrogen.

<<Counter Substrate>>

As the counter substrate 170, a substrate similar to the substrate 110 can be used as long as it has a light-transmitting property.

A structure such as micro lenses or an uneven structure can be formed on a surface of the counter substrate 170. Such a structure can be formed by a stamping method, a vacuum molding method, a blast process, a frost process, or the like. Alternatively, a substrate over which a film or the like that is provided with an uneven structure in advance is stacked may be used.

Providing such a structure on the light-emitting element side of the counter substrate 170 allows light emitted by the light-emitting element to enter the counter substrate 170 at various angles. Providing such a structure on the light extraction side of the counter substrate 170 allows light emitted by the light-emitting element to be emitted outside through the counter substrate 170 at various angles. Thus, a condition under which light is totally reflected repeatedly at the interface is not easily satisfied. As a result, light emitted by the light-emitting element can be extracted outside more efficiently.

The counter substrate 170 described as an example in this embodiment is a non-alkali glass substrate.

<<Absorption Layer>>

The absorption layer 160 includes a dye. The dye absorbs at least part of visible light. For example, a metal complex dye or an organic dye can be used.

Specifically, examples of a metal complex dye and an organic dye include a porphyrin dye, a chlorophyll dye, a phthalocyanine dye, a naphthalocyanine dye, a monomethine dye, a polymethine dye, a cyanine dye, a hemicyanine dye, a streptocyanine dye, a merocyanine dye, a rhodacyanine dye, an oxonol dye, a polyene dye, a styryl dye, a stilbene dye, an azine dye, an oxazine dye, a thiazine dye, an azomethine dye, an azo dye, a triphenylmethane dye, a pyronin dye, a fluorescein dye, a rhodamine dye, a uranin dye, an eosin dye, an erythrosine dye, a rose bengal dye, a mercurochrome dye, an acridine dye, a naphthoquinone dye, an anthraquinone dye, a coumarin dye, a diketo-pyrrolopyrrole dye, an indigo dye, a thioindigo dye, a quinacridone dye, a squarylium dye, a croconium dye, an anthracene dye, a perylene dye, a pyrene dye, a pyrylium dye, a benzopyran dye, a perimidine dye, a quinoxaline dye, a naphthalimide dye, a deazaflavin dye, a mauve dye, a fulgide dye, a procion dye, a benzodifuranone dye, a xanthene dye, a triphenylmethane dye, a fluoran dye, a quinophthalone dye, a naphtholactam dye, an imidazole azo dye, a tricyanostyryl dye, a benzothiazole azo dye, a benzene azo dye, a pyrazolotriazole dye, an isothiazole azo dye, and a pyrazolone azomethine dye.

The absorption layer 160 can include an adhesive. With the absorption layer 160 including an adhesive, the counter substrate 170 can be attached to the substrate 110.

A resin can be used as the adhesive. Examples of resins include polyester, polyolefin, polyamide, polyimide, polycarbonate, an epoxy resin, and an acrylic resin.

The absorption layer 160 has a refractive index higher than that of the air, preferably a refractive index of greater than or equal to 1.4 and less than or equal to 2.0. Thus, the absorption layer 160 can also serve as an optical bonding layer and light emitted by the light-emitting module can efficiently enter the absorption layer 160.

Modification Example

A modification example of the light-emitting device in this embodiment will be described with reference to FIGS. 1B1 and 1B2.

FIG. 1B1 is a schematic cross-sectional view of a light-emitting panel 100B of one embodiment of the present invention. FIG. 1B2 shows an absorption spectrum and emission spectra of the absorption layer 160 and light-emitting modules included in the light-emitting panel 100B.

The light-emitting panel 100B described as a modification example in this embodiment differs from the light-emitting device 100 described with reference to FIGS. 1A1 and 1A2 in that it includes a plurality of light-emitting modules. Thus, different portions will be described in detail below. Refer to the description using FIGS. 1A1 and 1A2 for portions where similar structures can be employed.

The light-emitting panel 100B described as a modification example in this embodiment includes the absorption layer 160, the first conductive film 125R and a second conductive film 125G that are overlapped with the absorption layer 160, the first light-emitting module 180R electrically connected to the first conductive film 125R, and a second light-emitting module 180G electrically connected to the second conductive film 125G (see FIG. 1B1).

The first conductive film 125R and the second conductive film 125G reflect visible light.

The first light-emitting module 180R emits light with the spectrum 180Em(R) having a peak at the first wavelength $\lambda(R)$ in a visible light region toward the absorption layer 160. The second light-emitting module 180G emits light with a spectrum 180Em(G) having a peak at a second wavelength $\lambda(G)$ that is different from the first wavelength $\lambda(R)$ in the visible light region toward the absorption layer 160.

The absorption layer 160 absorbs part of light with wavelengths shorter than the first wavelength $\lambda(R)$ and part of light with wavelengths longer than the first wavelength $\lambda(R)$ more easily than light with the first wavelength $\lambda(R)$.

In addition, the absorption layer 160 absorbs part of light with wavelengths shorter than the second wavelength $\lambda(G)$ and part of light with wavelengths longer than the second wavelength $\lambda(G)$ more easily than light with the second wavelength $\lambda(G)$.

For example, an absorption spectrum 160Abs of the absorption layer 160 exhibits an absorption Abs(R) at the wavelength $\lambda(R)$, an absorption Abs(4) higher than the absorption Abs(R) at a wavelength shorter than the wavelength $\lambda(R)$, and an absorption Abs(5) higher than the absorption Abs(R) at a wavelength longer than the wavelength $\lambda(R)$.

In addition, the absorption spectrum 160Abs exhibits an absorption Abs(G) at the wavelength $\lambda(G)$, an absorption Abs(3) higher than the absorption Abs(G) at a wavelength shorter than the wavelength $\lambda(G)$, and the absorption Abs(5) higher than the absorption Abs(G) at a wavelength longer than the wavelength $\lambda(G)$.

The light-emitting panel 100B described as a modification example in this embodiment includes the first light-emitting module 180R that emits light with the spectrum 180Em(R) having a peak at the first wavelength $\lambda(R)$ in a visible light region, the second light-emitting module 180G that emits light with the spectrum 180Em(G) having a peak at the second wavelength $\lambda(G)$ in the visible light region, and the absorption layer 160 that absorbs part of light with wavelengths shorter than the first wavelength $\lambda(R)$ and part of light with wavelengths longer than the first wavelength $\lambda(R)$ more easily than light with the first wavelength $\lambda(R)$ and absorbs part of light with wavelengths shorter than the second wavelength $\lambda(G)$ and part of light with wavelengths longer than the second wavelength $\lambda(G)$ more easily than light with the second wavelength $\lambda(G)$.

Thus, part of the external light 11 that enters from the outside of the light-emitting panel 100B and passes through the absorption layer 160 toward the first reflective conductive film 125R or the second reflective conductive film 125G can be absorbed by the absorption layer 160 before reaching the first conductive film 125R or the second conductive film 125G. Further, part of light that is reflected by the first conductive film 125R or the second conductive film 125G can be absorbed by the absorption layer 160 before being emitted outside through the absorption layer 160. Consequently, the intensity of light derived from the external light 11 that is reflected by the first conductive film 125R or the second conductive film 125G to be emitted outside can be reduced.

The absorption layer 160 transmits light with the wavelength $\lambda(R)$ more easily than part of light with wavelengths shorter than the wavelength λ(R) and part of light with wavelengths longer than the wavelength λ(R). Further, the absorption layer 160 transmits light with the wavelength λ(G) more easily than part of light with wavelengths shorter than the wavelength λ(G) and part of light with wavelengths longer than the wavelength λ(G). In other words, the absorption layer 160 does not easily absorb light with the wavelength λ(R) that is emitted by the first light-emitting module 180R and light with the wavelength λ(G) that is emitted by the second light-emitting module 180G.

As a result, a phenomenon in which a user cannot distinguish whether light from the light-emitting panel 100B is derived from reflection of the external light 11 or from light emission by the first light-emitting module 180R or the second light-emitting module 180G is unlikely to occur.

The light-emitting panel 100B described as a modification example in this embodiment has the same structure as the light-emitting device 100 described in this embodiment except that the first light-emitting module 180R and the second light-emitting module 180G are provided over the substrate 110.

Components that are included in the light-emitting panel 100B described as a modification example in this embodiment and are not included in the light-emitting device 100 are described below.

<<Light-Emitting Module>>

The second light-emitting module 180G is configured to emit light with the spectrum 180Em(G), which is different from the spectrum 180Em(R) of light emitted by the first light-emitting module 180R.

For example, the first light-emitting module 180R and the second light-emitting module 180G each include a light-emitting element and an optical element, specifically an organic electroluminescent element and a microresonator. In particular, each light-emitting module includes an organic electroluminescent element that emits light including red light and green light.

The thickness of the first lower electrode 151R is adjusted so that light emitted by the first light-emitting module 180R has the spectrum 180Em(R) having a peak at the first wavelength λ(R).

The thickness of a second lower electrode 151G is adjusted so that light emitted by the second light-emitting module 180G has the spectrum 180Em(G) having a peak at the second wavelength λ(G).

This embodiment can be combined with any of the other embodiments in this specification as appropriate.

Embodiment 2

In this embodiment, a structure of a display panel of one embodiment of the present invention is described with reference to FIGS. 2A to 2C and FIG. 3.

FIG. 2A is a plan view illustrating a structure of a display panel that can be applied to a display panel of one embodiment of the present invention.

Figure 2B:
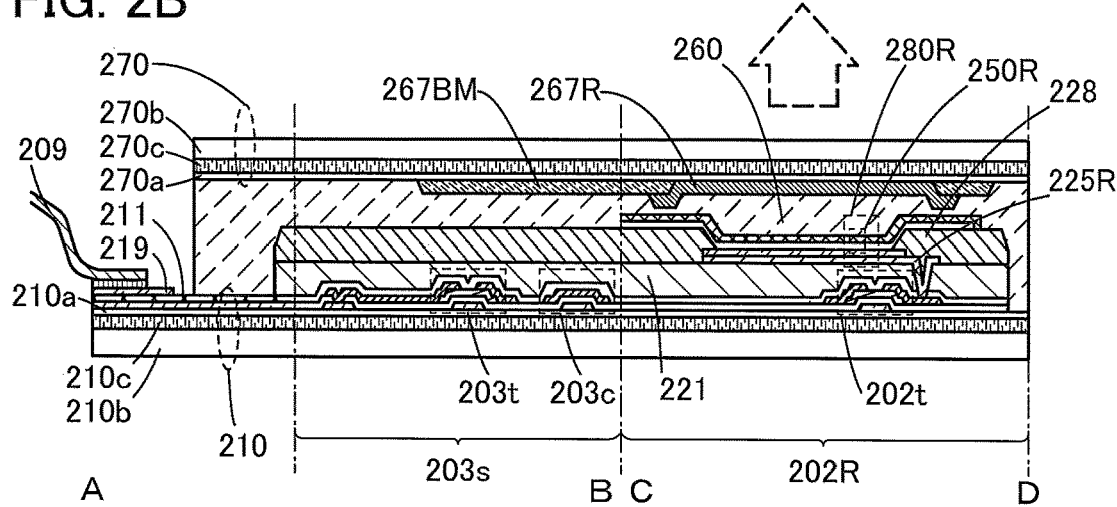

FIG. 2B is a cross-sectional view taken along line A-B and line C-D in FIG. 2A.

Figure 2C:
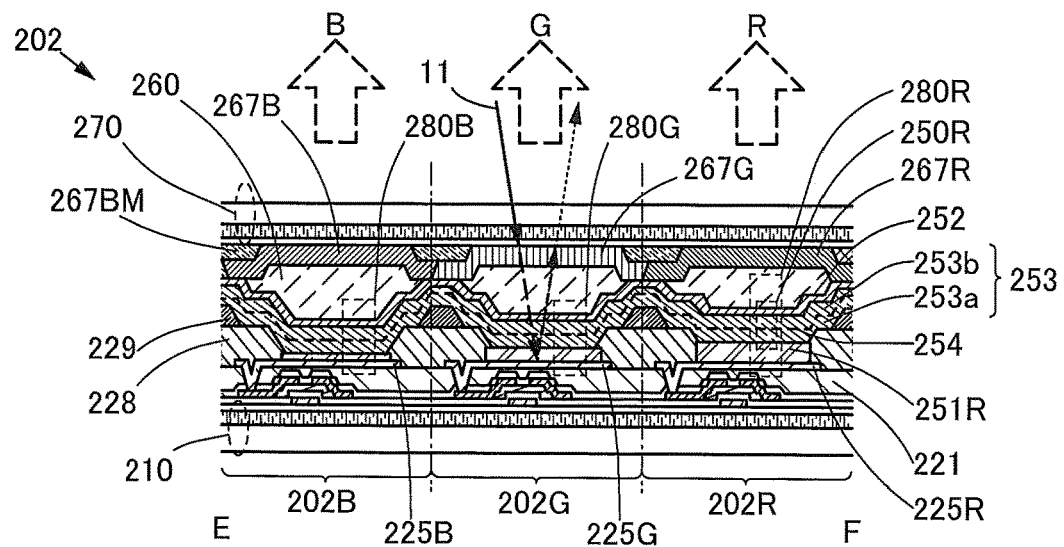

FIG. 2C is a cross-sectional view taken along line E-F in FIG. 2A.

A display panel 200 of one embodiment of the present invention described in this embodiment includes an absorption layer 260, a first conductive film 225R, a second conductive film 225G, and a third conductive film 225B that are overlapped with the absorption layer 260, a first light-emitting module 280R electrically connected to the first conductive film 225R, a second light-emitting module 280G electrically connected to the second conductive film 225G, and a third light-emitting module 280B electrically connected to the third conductive film 225B (see FIG. 2C).

The first conductive film 225R, the second conductive film 225G, and the third conductive film 225B reflect visible light.

Figure 3:
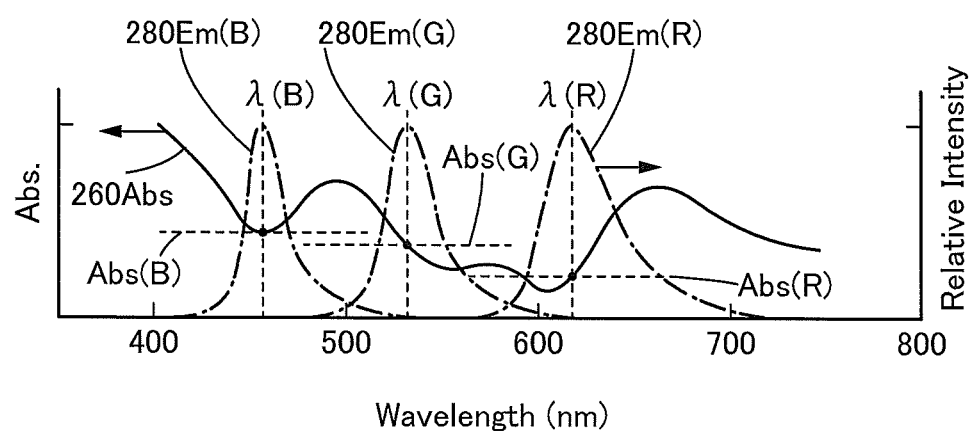
FIG. 3 illustrates a display panel according to an embodiment.

The first light-emitting module 280R emits light with a spectrum 280Em(R) having a peak at the first wavelength λ(R) in a visible light region toward the absorption layer 260 (see FIG. 3).

The second light-emitting module 280G emits light with a spectrum 280Em(G) having a peak at the second wavelength λ(G) in the visible light region toward the absorption layer 260.

The third light-emitting module 280B emits light with a spectrum 280Em(B) having a peak at a third wavelength λ(B) in the visible light region toward the absorption layer 260.

The absorption layer 260 absorbs part of light with wavelengths shorter than the first wavelength λ(R) and part of light with wavelengths longer than the first wavelength λ(R) more easily than light with the first wavelength λ(R). In other words, the absorption layer 260 exhibits absorptions higher than an absorption Abs(R) at the first wavelength λ(R) on the shorter wavelength side and the longer wavelength side with respect to the first wavelength λ(R).

Further, the absorption layer 260 absorbs part of light with wavelengths shorter than the second wavelength λ(G) and part of light with wavelengths longer than the second wavelength λ(G) more easily than light with the second wavelength λ(G). In other words, the absorption layer 260 exhibits absorptions higher than an absorption Abs(G) at the second wavelength λ(G) on the shorter wavelength side and the longer wavelength side with respect to the second wavelength λ(G).

Further, the absorption layer 260 absorbs part of light with wavelengths shorter than the third wavelength λ(B) and part of light with wavelengths longer than the third wavelength λ(B) more easily than light with the third wavelength λ(B). In other words, the absorption layer 260 exhibits absorptions higher than an absorption Abs(B) at the third wavelength λ(B) on the shorter wavelength side and the longer wavelength side with respect to the third wavelength λ(B).

For example, an absorption spectrum 260Abs of the absorption layer 260 exhibits the absorption Abs(R) at the wavelength λ(R), an absorption higher than the absorption Abs(R) at a wavelength shorter than the wavelength λ(R), and an absorption higher than the absorption Abs(R) at a wavelength longer than the wavelength λ(R). In addition, the absorption spectrum 260Abs exhibits the absorption Abs(G) at the wavelength λ(G), an absorption higher than the absorption Abs(G) at a wavelength shorter than the wavelength λ(G), and an absorption higher than the absorption Abs(G) at a wavelength longer than the wavelength λ(G). In addition, the absorption spectrum 260Abs exhibits the absorption Abs(B) at the wavelength λ(B), an absorption higher than the absorption Abs(B) at a wavelength shorter than the wavelength λ(B), and an absorption higher than the absorption Abs(B) at a wavelength longer than the wavelength λ(B).

In addition, in the display panel 200 of one embodiment of the present invention described in this embodiment, the absorption layer 260 absorbs part of light with wavelengths between the second wavelength λ(G) and the third wavelength λ(B) more easily than light with the second wavelength λ(G) and light with the third wavelength λ(B) (see FIG. 3).

The display panel 200 of one embodiment of the present invention described in this embodiment includes the absorption layer that absorbs part of light with wavelengths shorter than the second wavelength λ(G) and part of light with wavelengths longer than the second wavelength λ(G) more easily than light with the second wavelength λ(G), absorbs part of light with wavelengths shorter than the third wavelength λ(B) and part of light with wavelengths longer than the third wavelength λ(B) more easily than light with the third wavelength λ(B), and absorbs part of light with wavelengths between the second wavelength λ(G) and the third wavelength λ(B) more easily than light with the second wavelength λ(G) and light with the third wavelength λ(B).

Thus, part of the external light 11 that enters from the outside of the display panel 200 and passes through the absorption layer 260 toward the first reflective conductive film 225R, the second reflective conductive film 225G, or the third reflective conductive film 225B can be absorbed by the absorption layer 260 before reaching the conductive film. Further, part of light that is reflected by the conductive film can be absorbed by the absorption layer 260 before being emitted outside the display panel 200 through the absorption layer 260. Consequently, the intensity of light derived from the external light 11 that is reflected by at least one of the conductive films to be emitted outside can be reduced.

With this structure, it is possible to provide a novel display panel in which lowering of display contrast under strong external light can be prevented. It is also possible to provide a novel display panel in which a problem (e.g., perception of a pattern of interference fringes) that is attributed to interference between light reflected by light-emitting modules in regularly arranged structures (e.g., sub-pixels) can be prevented.

Note that in the display panel 200 of one embodiment of the present invention described in this embodiment, a sub-pixel 202R includes the first light-emitting module 280R that emits light with the spectrum 280Em(R) having a peak at the first wavelength λ(R) and a half width of greater than or equal to 35 nm and less than or equal to 95 nm. A sub-pixel 202G includes the second light-emitting module 280G that emits light with the spectrum 280Em(G) having a peak at the second wavelength λ(G) and a half width of greater than or equal to 25 nm and less than or equal to 35 nm. A sub-pixel 202B includes the third light-emitting module 280B that emits light with the spectrum 280Em(B) having a peak at the third wavelength λ(B) and a half width of greater than or equal to 15 nm and less than or equal to 30 nm (see FIG. 3).

The display panel 200 of one embodiment of the present invention described in this embodiment includes light-emitting modules that each emit visible light with a spectrum having a narrow half width. Thus, light emitted by the first light-emitting module 280R, the second light-emitting module 280G, and the third light-emitting module 280B can be prevented from being absorbed by the absorption layer 260. Consequently, it is possible to provide a novel display panel in which light emitted by these light-emitting modules can be extracted efficiently.

Note that in the display panel 200 of one embodiment of the present invention described in this embodiment, the first light-emitting module 280R, the second light-emitting module 280G, and the third light-emitting module 280B each include a microresonator structure.

Thus, the half width of the spectrum of light emitted by each of the first light-emitting module 280R, the second light-emitting module 280G, and the third light-emitting module 280B can be narrowed. Note that light with a spectrum having a narrow half width exhibits a vivid color. Using such light for display enables images with vivid colors to be displayed.

In the display panel 200 of one embodiment of the present invention described in this embodiment, the first conductive films 225R and the first light-emitting modules 280R electrically connected to the first conductive films 225R are arranged with a resolution of greater than or equal to 200 ppi and less than or equal to 1000 ppi.

The display panel 200 of one embodiment of the present invention described in this embodiment includes the absorption layer 260 that can absorb light reflected by conductive films (e.g., the first conductive film 225R) that are electrically connected to light-emitting modules (e.g., the first light-emitting module 280R) arranged with high spatial frequency.

This structure not only enables display of excellent high-resolution images but also weakens light reflected by the arranged first conductive films 225R, for example, and makes interference of light unlikely to occur. Consequently, it is possible to provide a novel display panel in which undesired light generated by interference (e.g., a pattern of interference fringes) can be reduced.

Note that the display panel 200 of one embodiment of the present invention described in this embodiment includes the absorption layer 260 that is in contact with the first light-emitting module 280R, the second light-emitting module 280G, and the third light-emitting module 280B and has a refractive index of greater than or equal to 1.4 and less than or equal to 2.0.

Thus, light emitted by the first light-emitting module 280R, for example, efficiently enters the absorption layer 260. Consequently, it is possible to provide a novel display panel in which light emitted by the first light-emitting module 280R can be extracted outside efficiently.

The display panel 200 described as an example in this embodiment has the structure described below.

<Plan View>

The display panel 200 described as an example in this embodiment includes a display region 201 (see FIG. 2A).

In the display region 201, a plurality of pixels 202 is provided, and a plurality of sub-pixels (e.g., the sub-pixel 202R) is provided in each of the pixels 202. In the sub-pixels, light-emitting elements and pixel circuits that can supply power for driving the light-emitting elements are provided.

Note that interference occurs in accordance with Formula (I) between light reflected by light-emitting modules in regularly arranged structures such as sub-pixels.

[Formula 1]

$$D = \frac{\lambda \cdot L}{d} \quad (1)$$

In Formula (1), d represents the interval between regularly arranged structures, λ represents the wavelength of light with which the structures are irradiated, L represents the distance between the structures and the position from which interference of reflected light is perceived, and D represents the interval between perceived interference fringes.

Interference occurs between light reflected by regularly arranged structures. Thus, the higher the spatial frequency of the structures is (the smaller d is), the larger the interval (D)

between perceived interference fringes is. For example, when the structures are regularly arranged with a spatial frequency of greater than or equal to 200 and less than or equal to 1000 per inch, light generated by interference (e.g., a pattern of interference fringes) is likely to be noticed and therefore is even more undesirable.

The pixel circuits are electrically connected to wirings through which selection signals are supplied and wirings through which data signals are supplied.

Furthermore, the display panel 200 is provided with a scan line driver circuit 203g that can supply selection signals and a data line driver circuit 203s that can supply data signals.

<Cross-Sectional View>

The display panel 200 includes a substrate 210 and a counter substrate 270 that faces the substrate 210 (see FIG. 2B).

The substrate 210 is a stacked body including a flexible substrate 210b, a barrier film 210a that prevents diffusion of unintentional impurities to the light-emitting elements, and an adhesive layer 210c that attaches the barrier film 210a to the substrate 210b.

The counter substrate 270 is a stacked body including a flexible substrate 270b, a barrier film 270a that prevents diffusion of unintentional impurities to the light-emitting elements, and an adhesive layer 270c that attaches the barrier film 270a to the substrate 270b.

The absorption layer 260 serves as both an optical bonding layer and a sealant. Light emitted by the first light-emitting module 280R can efficiently enter the absorption layer 260. In addition, the absorption layer 260 attaches the counter substrate 270 to the substrate 210.

Note that the pixel circuits and the light-emitting elements (e.g., a first light-emitting element 250R) are provided between the substrate 210 and the counter substrate 270.

<<Structure of Pixel>>

Each of the pixels 202 includes the sub-pixel 202R, the sub-pixel 202G, and the sub-pixel 202B (see FIG. 2C). The sub-pixel 202R includes the first light-emitting module 280R and a first coloring layer 267R, the sub-pixel 202G includes the second light-emitting module 280G and a second coloring layer 267G, and the sub-pixel 202B includes the third light-emitting module 280B and a third coloring layer 267B.

For example, the sub-pixel 202R includes the first light-emitting element 250R and the pixel circuit that can supply power to the first light-emitting element 250R and includes a transistor 202t (see FIG. 2B). Furthermore, the sub-pixel 202R includes the first light-emitting module 280R, and the first light-emitting module 280R includes the first light-emitting element 250R and an optical element (e.g., a microresonator).

The first light-emitting module 280R includes the first conductive film 225R and a semi-transmissive and semi-reflective conductive film overlapping with the first conductive film 225R. The first light-emitting element 250R is provided between the first conductive film 225R and the semi-transmissive and semi-reflective conductive film. Note that the upper electrode 252 of the first light-emitting element 250R also serves as the semi-transmissive and semi-reflective conductive film (see FIG. 2C).

Note that the first conductive film 225R reflects light emitted by the first light-emitting element 250R, and the semi-transmissive and semi-reflective upper electrode 252 reflects part of light emitted by the first light-emitting element 250R and transmits another part thereof. The distance between the first conductive film 225R and the upper electrode 252 is adjusted so that part of light emitted by the first light-emitting element 250R is efficiently extracted. Such a structure forms a microresonator.

The first light-emitting element 250R includes a first lower electrode 251R, the upper electrode 252, and a layer 253 containing a light-emitting organic compound between the first lower electrode 251R and the upper electrode 252.

The layer 253 containing a light-emitting organic compound includes a light-emitting unit 253a, a light-emitting unit 253b, and an intermediate layer 254 between the light-emitting units 253a and 253b.

The sub-pixel 202R includes the first coloring layer 267R overlapping with the first light-emitting module 280R on the counter substrate 270, the sub-pixel 202G includes the second coloring layer 267G overlapping with the second light-emitting module 280G on the counter substrate 270, and the sub-pixel 202B includes the third coloring layer 267B overlapping with the third light-emitting module 280B on the counter substrate 270 (see FIG. 2C). Accordingly, for example, part of light emitted by the first light-emitting module 280R passes through the first coloring layer 267R and is emitted outside the display panel 200 as indicated by the arrow in the drawing.

The coloring layer transmits light including light with a specific wavelength and is, for example, a layer that selectively transmits light of red, green, blue, magenta, yellow, or cyan. A region that transmits light emitted from the light-emitting element as it is may be provided as well.

<<Structure of Absorption Layer>>

The absorption layer 260 includes a dye. The dye absorbs at least part of visible light. For example, the absorption layer 260 can have a structure similar to that of the absorption layer 160 described in Embodiment 1.

In particular, the absorption layer 260 preferably absorbs part of light with wavelengths between the two peaks of the spectra of two light-emitting modules (e.g., the second light-emitting module 280G and the third light-emitting module 280B) that emit light with spectra (e.g., the spectrum 280Em(G) and the spectrum 280Em(B)) having peaks at different wavelengths (e.g., the second wavelength λ(G) and the third wavelength λ(B)) more easily than light with one of the peak wavelengths and light with the other of the peak wavelengths.

The absorption layer 260 as described above can be formed using one dye that absorbs part of visible light or a mixture of a plurality of dyes that are selected as appropriate.

In addition, the absorption layer 260 attaches the counter substrate 270 to the substrate 210.

The absorption layer 260 is in contact with the light-emitting module (e.g., the first light-emitting module 280R) and the coloring layer (e.g., the first coloring layer 267R) and has a refractive index higher than that of the air. For example, the absorption layer 260 preferably has a refractive index of greater than or equal to 1.4 and less than or equal to 2.0.

Thus, the absorption layer 260 can also serve as an optical bonding layer and light emitted by the light-emitting module can efficiently enter the absorption layer 260.

Note that another layer having a refractive index higher than that of the air may be provided between the absorption layer 260 and a light-emitting element. Further, another layer having a refractive index higher than that of the air may be provided between the absorption layer 260 and a coloring layer. Such a layer preferably has a refractive index of greater than or equal to 1.4 and less than or equal to 2.0.

<<Structure of Display Panel>>

The display panel 200 includes a light-blocking layer 267BM on the counter substrate 270. The light-blocking layer 267BM is provided so as to surround the coloring layer (e.g., the first coloring layer 267R) (see FIG. 2B).

The display panel 200 includes an insulating film 221. The insulating film 221 covers the transistor 202t. Note that the insulating film 221 can be used to planarize unevenness caused by the pixel circuits. Further, a stacked film of dense inorganic films (e.g., a film containing nitrogen and silicon) can be used as the insulating film 221 to prevent diffusion of unintentional impurities to the transistor 202t or the like.

The display panel 200 includes the light-emitting elements (e.g., the first light-emitting element 250R) over the insulating film 221.

The display panel 200 includes, over the insulating film 221, a partition wall 228 that overlaps with an end portion of the first lower electrode 251R (see FIG. 2C). In addition, a spacer 229 that controls the distance between the substrate 210 and the counter substrate 270 is provided on the partition wall 228.

<<Structure of Data Line Driver Circuit>>

The data line driver circuit 203s includes a transistor 203t and a capacitor 203c. Note that the driver circuit can be formed in the same process and over the same substrate as those of the pixel circuits (see FIG. 2B).

<<Other Structures>>

The display panel 200 includes a wiring 211 through which a signal can be supplied. The wiring 211 is provided with a terminal 219. Note that a flexible printed circuit (FPC) 209 through which a signal such as a data signal or a synchronization signal can be supplied is electrically connected to the terminal 219.

Note that a printed wiring board (PWB) may be attached to the FPC. The light-emitting device in this specification includes, in its category, not only a light-emitting device itself but also a light-emitting device provided with an FPC or a PWB.

Modification Example

A modification example of the display panel in this embodiment will be described with reference to FIG. 4.

Figure 4:
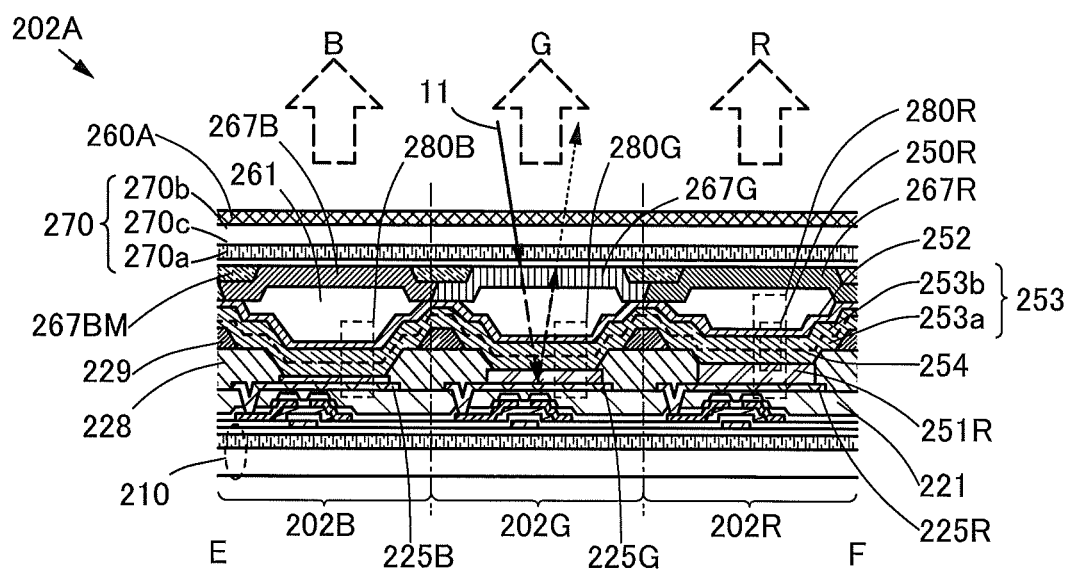
FIG. 4 illustrates a pixel of a display panel according to an embodiment.

FIG. 4 is a schematic cross-sectional view of a pixel in a display panel of one embodiment of the present invention.

A pixel 202A in the display panel described as a modification example in this embodiment differs from the pixel 202 in the display panel described with reference to FIG. 2C in that an absorption layer 260A does not attach the counter substrate 270 to the substrate 210. Thus, different portions will be described in detail below. Refer to the description using FIG. 2C for portions where similar structures can be employed.

The pixel 202A in the display panel described as a modification example in this embodiment includes the counter substrate 270 between the absorption layer 260A and light-emitting modules (e.g., the first light-emitting module 280R) (see FIG. 4). The first light-emitting module 280R is provided between the substrate 210 and the counter substrate 270 overlapping with the substrate 210, and the counter substrate 270 is attached to the substrate 210 with an adhesive layer 261.

Alternatively, part of the counter substrate can also serve as an absorption layer. For example, in the case where the counter substrate 270 is a stacked body including the flexible substrate 270b, the barrier film 270a that prevents diffusion of unintentional impurities to the light-emitting element, and the adhesive layer 270c that attaches the barrier film 270a to the substrate 270b, it is possible to add a dye to one of the components of the stacked body to use the component as an absorption layer. Specifically, the adhesive layer 270c or flexible substrate 270b to which a dye is added can be used as an absorption layer.

This embodiment can be combined with any of the other embodiments in this specification as appropriate.

Embodiment 3

In this embodiment, a structure of a light-emitting element that can be used for the light-emitting device of one embodiment of the present invention is described. Specifically, an example of a light-emitting element in which a layer containing a light-emitting organic compound is provided between a pair of electrodes is described with reference to FIGS. 5A to 5E.

The light-emitting element described as an example in this embodiment includes a lower electrode, an upper electrode, and a layer containing a light-emitting organic compound (hereinafter referred to as an EL layer) provided between the lower electrode and the upper electrode. The EL layer may be a single layer or a stacked layer of a plurality of layers as long as one layer contains a light-emitting organic compound. One of the lower and upper electrodes functions as an anode, and the other functions as a cathode. The EL layer is provided between the lower electrode and the upper electrode, and a structure of the EL layer may be determined as appropriate in accordance with materials of the lower electrode and the upper electrode. Examples of the structure of the light-emitting element are described below; needless to say, the structure of the light-emitting element is not limited to the examples.

Structure Example 1 of Light-Emitting Element

Figure 5A:
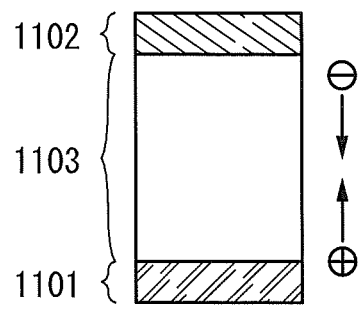
FIGS. 5A to 5E each illustrate a light-emitting element that can be applied to a light-emitting device and a display panel according to an embodiment.

An example of the structure of the light-emitting element is illustrated in FIG. 5A. In the light-emitting element illustrated in FIG. 5A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer in a region where electrons and holes injected from both ends are recombined is referred to as a light-emitting layer, and a layer or a stacked body that includes one light-emitting layer is referred to as a light-emitting unit. Therefore, it can be said that Structure Example 1 of the light-emitting element includes one light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 5B:
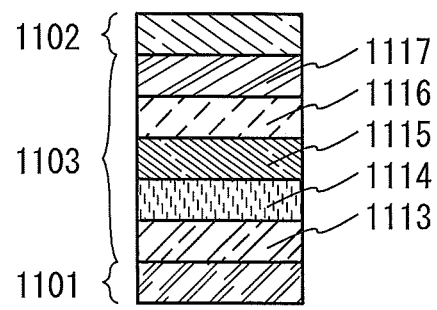

An example of a specific structure of the light-emitting unit 1103 is illustrated in FIG. 5B. In the light-emitting unit 1103 illustrated in FIG. 5B, a hole-injection layer 1113, a hole-transport layer 1114, a light-emitting layer 1115, an electron-transport layer 1116, and an electron-injection layer 1117 are stacked in this order from the anode 1101 side.

Structure Example 2 of Light-Emitting Element

Figure 5C:
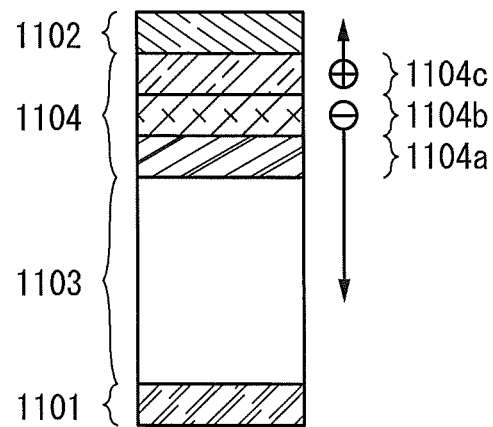

Another example of the structure of the light-emitting element is illustrated in FIG. 5C. In the light-emitting element illustrated in FIG. 5C, an EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 is formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behavior of electrons and holes in the intermediate layer 1104 will be described. When voltage higher than the threshold voltage of the light-emitting element is applied between the anode 1101 and the cathode 1102, holes and electrons are generated in the first charge generation region 1104c, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can lower a barrier against electron injection into the light-emitting unit 1103, so that the efficiency of the electron injection into the light-emitting unit 1103 is increased. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface therebetween and the functions of the first charge generation region 1104c and the electron-injection buffer 1104a are impaired.

The range of choices of materials that can be used for the cathode in Structure Example 2 of the light-emitting element is wider than that of materials that can be used for the cathode in Structure Example 1 of the light-emitting element. This is because the cathode in Structure Example 2 can be formed using a material having a relatively high work function as long as the cathode receives holes generated in the intermediate layer.

Structure Example 3 of Light-Emitting Element

Figure 5D:
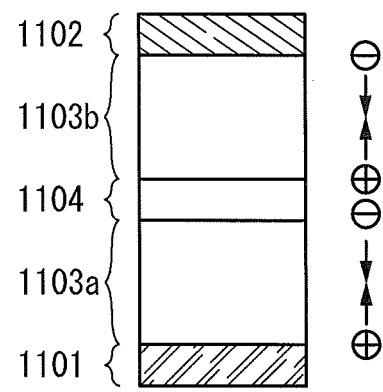
Figure 5E:
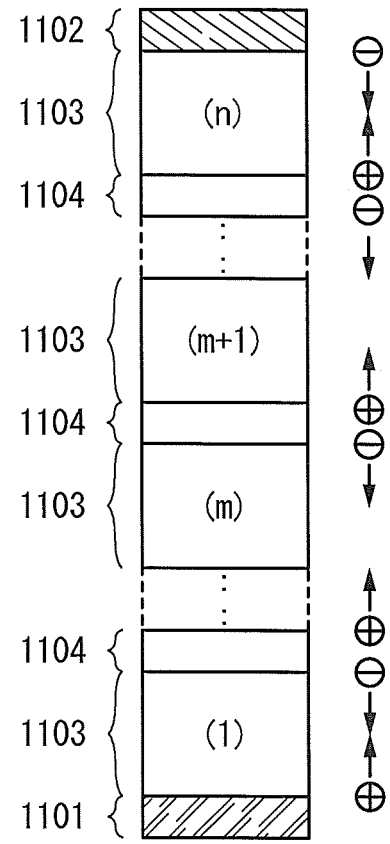

Another example of the structure of the light-emitting element is illustrated in FIG. 5D. In the light-emitting element illustrated in FIG. 5D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 5E has what is called a tandem structure, that is, a structure in which a plurality of light-emitting units 1103 are stacked. Note that in the case where n (n is a natural number greater than or equal to 2) light-emitting units 1103 are provided between the anode and the cathode, the intermediate layer 1104 is provided between an m-th (in is a natural number greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Therefore, the description of Structure Example 1 of the light-emitting element or the description of Structure Example 2 of the light-emitting element can be referred to for the details.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Structure Examples 1 to 3 of the light-emitting element can be implemented in combination. For example, an intermediate layer may be provided between the cathode and the light-emitting unit in Structure Example 3 of the light-emitting element.

<Structure Including Microresonator>

Note that a microresonator (microcavity) composed of a reflective film and a semi-transmissive and semi-reflective film overlapping with the reflective film may be placed so as to sandwich a light-emitting element. By placing the light-emitting element in the microresonator, interference of light emitted from the light-emitting element occurs, so that light of a specific color can be efficiently extracted.

Note that the semi-transmissive and semi-reflective film in this specification refers to a film that transmits part of incident light and reflects another part thereof. The semi-transmissive and semi-reflective film used for the microresonator preferably absorbs less light.

The wavelength of extracted light depends on the distance between the reflective film and the semi-transmissive and semi-reflective film. An optical adjustment layer for adjusting the distance between the reflective film and the semi-transmissive and semi-reflective film may be provided in the light-emitting element in some cases.

A conductive film having properties of transmitting visible light or an EL layer can be used as a material that can be used for the optical adjustment layer.

For example, a stacked-layer film including a light-transmitting conductive film and a reflective film, or a stacked-layer film including a light-transmitting conductive film and a semi-transmissive and semi-reflective film can be used as a lower electrode or an upper electrode which also serves as the optical adjustment layer.

An interlayer whose thickness is adjusted may be used as the optical adjustment layer. Alternatively, a region whose thickness is adjusted and which contains a substance having a high hole-transport property and an acceptor substance with respect to the substance having a high hole-transport property can be used for the optical adjustment layer. The electric resistance of this component is lower than that of other components included in the EL layer. Thus, even if the thickness is increased for optical adjustment, this structure is preferable because an increase in driving voltage of a light-emitting element can be suppressed.

<Material for Light-Emitting Element>

Next, specific materials that can be used for the light-emitting elements having the above structures are described; materials for the anode, the cathode, and the EL layer are described in this order.

<<1. Material for Anode>>

The anode 1101 is formed with a single-layer structure or a stacked structure using any of a metal, an alloy, an electrically conductive compound, and a mixture thereof which have conductivity. In particular, a structure is preferred in which a material having a high work function (specifically, 4.0 eV or higher) is in contact with the EL layer.

Examples of the metal or the alloy material include gold (Au), platinum (Pt), nickel (Ni), tungsten (W), chromium (Cr), molybdenum (Mo), iron (Fe), cobalt (Co), copper (Cu), palladium (Pd), and titanium (Ti), and an alloy thereof.

Examples of the electrically conductive compound include an oxide of a metal material, a nitride of a metal material, and a conductive high molecule.

Specific examples of the oxide of a metal material include indium tin oxide (ITO), indium tin oxide containing silicon or silicon oxide, indium tin oxide containing titanium, indium titanium oxide, indium tungsten oxide, indium zinc oxide, and indium zinc oxide containing tungsten. Specific examples of the oxide of a metal material further include molybdenum oxide, vanadium oxide, ruthenium oxide, tungsten oxide, manganese oxide, and titanium oxide.

A film of the oxide of a metal material is usually formed by a sputtering method, but may be formed by application of a sol-gel method or the like.

Specific examples of the nitride of a metal material include titanium nitride and tantalum nitride.

Specific examples of the conductive high molecule include poly(3,4-ethylenedioxythiophene)/poly(styrenesulfonic acid) (PEDOT/PSS) and polyaniline/poly(styrenesulfonic acid) (PAni/PSS).

Note that in the case where the second charge generation region is provided in contact with the anode 1101, a variety of electrically conductive materials can be used for the anode 1101 regardless of their work functions. Specifically, besides a material having a high work function, a material having a low work function can also be used for the anode 1101. Materials that can be used for the second charge generation region and the first charge generation region are described later.

<<2. Material for Cathode>>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For example, when one of the cathode 1102 and the anode 1101 is formed using a conductive film that transmits visible light and the other is formed using a conductive film that reflects visible light, a light-emitting element that emits light from one side can be formed. Alternatively, when both the cathode 1102 and the anode 1101 are formed using conductive films that transmit visible light, a light-emitting element that emits light from both sides can be formed.

Examples of the conductive film that transmits visible light include a film of indium tin oxide, a film of indium tin oxide containing silicon or silicon oxide, a film of indium tin oxide containing titanium, a film of indium titanium oxide, a film of indium tungsten oxide, a film of indium zinc oxide, and a film of indium zinc oxide containing tungsten. In addition, a metal thin film having a thickness small enough to transmit light (preferably, approximately 5 nm to 30 nm) can be used.

For the conductive film that reflects visible light, for example, metal may be used; specifically, a metal material such as silver, aluminum, platinum, gold, or copper, or an alloy material containing any of these may be used. Examples of the alloy containing silver include a silver-neodymium alloy and a magnesium-silver alloy. Examples of the alloy of aluminum include an aluminum-nickel-lanthanum alloy, an aluminum-titanium alloy, and an aluminum-neodymium alloy.

<<3. Material for EL Layer>>

Specific examples of materials for the layers included in the light-emitting unit 1103 are given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. Alternatively, the hole-injection layer can be formed using a phthalocyanine compound such as phthalocyanine ($H_2Pc$) or copper phthalocyanine (CuPc), a high molecular compound such as poly(3,4-ethylenedioxythiophene)/poly(styrenesulfonic acid) (PEDOT/PSS), or the like.

Note that the hole-injection layer may be formed using the second charge generation region. When the second charge generation region is used for the hole-injection layer, a variety of conductive materials can be used for the anode 1101 regardless of their work functions as described above.

Materials for the second charge generation region are described later together with the materials for the first charge generation region.

<<3.1. Hole-Transport Layer>>

The hole-transport layer is a layer containing a substance having a high hole-transport property. The hole-transport layer may have a stacked layer of two or more layers containing a substance having a high hole-transport property without limitation to a single layer. A substance having a hole-transport property higher than an electron-transport property is used. In particular, a substance having a hole mobility of $10^{-6}$ cm$^2$/Vs or higher is preferably used, in which case the driving voltage of the light-emitting element can be reduced.

As examples of the substance having a high hole-transport property, an aromatic amine compound such as 4,4'-bis[N-(1-naphthyl)-N-phenylamino]biphenyl (abbreviation: NPB or α-NPD) and a carbazole derivative such as 9-[4-(10-phenyl-9-anthracenyl)phenyl]-9H-carbazole (abbreviation: CzPA) can be given. A high molecular compound (e.g., poly(N-vinylcarbazole) (abbreviation: PVK)) or the like can also be used.

<<3.2. Light-Emitting Layer>>

The light-emitting layer is a layer containing a light-emitting substance. The light-emitting layer may have a stacked layer of two or more layers containing a light-emitting substance without limitation to a single layer. A fluorescent compound or a phosphorescent compound can be used as the light-emitting substance. A phosphorescent compound is preferably used as the light-emitting substance, in which case the emission efficiency of the light-emitting element can be increased.

As the light-emitting substance, a fluorescent compound (e.g., coumarin 545T), a phosphorescent compound (e.g., tris(2-phenylpyridinato)iridium(III) (abbreviation: Ir(ppy)$_3$)), or the like can be used.

The light-emitting substance is preferably dispersed in a host material. The host material preferably has higher excitation energy than the light-emitting substance.

As the material that can be used as the host material, the above-described substance having a high hole-transport property (e.g., an aromatic amine compound, a carbazole derivative, and a high molecular compound), a substance having a high electron-transport property (e.g., a metal complex having a quinoline skeleton or a benzoquinoline skeleton and a metal complex having an oxazole-based ligand or a thiazole-based ligand), which are described later, or the like can be used.

<<3.3. Electron-Transport Layer>>

The electron-transport layer is a layer containing a substance having a high electron-transport property. The electron-transport layer may have a stacked layer of two or more layers containing a substance having a high electron-transport property without limitation to a single layer. A substance having an electron-transport property higher than a hole-transport property is used. In particular, a substance having an electron mobility of $10^{-6}$ cm$^2$/Ns or higher is preferably used, in which case the driving voltage of the light-emitting element can be reduced.

Examples of the substance having a high electron-transport property include a metal complex having a quinoline skeleton or a benzoquinoline skeleton (e.g., tris(8-quinolinolato)aluminum (abbreviation: Alq)), a metal complex having an oxazole-based or thiazole-based ligand (e.g., bis[2-(2-hydroxyphenyl)benzoxazolato]zinc (abbreviation: Zn(BOX)$_2$)), and other compounds (e.g., bathophenanthroline (abbreviation: BPhen)). A high molecular compound (e.g., poly[(9,9-dihexylfluorene-2,7-diyl)-co-(pyridine-3,5-diyl)] (abbreviation: PF-Py)) or the like can also be used.

<<3.4. Electron-Injection Layer>>

The electron-injection layer is a layer containing a substance having a high electron-injection property. The electron-injection layer may have a stacked layer of two or more layers containing a substance having a high electron-injection property without limitation to a single layer. The electron-injection layer is preferably provided, in which case the efficiency of electron injection from the cathode 1102 can be increased, so that the driving voltage of the light-emitting element can be reduced.

Examples of the substance having a high electron-injection property include an alkali metal (e.g., lithium (Li), or cesium (Cs)), an alkaline earth metal (e.g., calcium (Ca)), a compound of such a metal (e.g., oxide (specifically, lithium oxide, or the like), a carbonate (specifically, lithium carbonate, cesium carbonate, or the like), and a halide (specifically, lithium fluoride (LiF), cesium fluoride (CsF), or calcium fluoride (CaF$_2$)).

Alternatively, the layer containing a high electron-injection property may be a layer containing a substance with a high electron-transport property and a donor substance (specifically, a layer made of Alq containing magnesium (Mg)). Note that the mass ratio of the added donor substance to the substance having a high electron-transport property is preferably 0.001:1 to 0.1:1.

As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal.

<<3.5. Charge Generation Region>>

The first charge generation region 1104c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing an acceptor substance is in contact with the anode 1101.

Note that the acceptor substance is preferably added to the charge generation region so that the mass ratio of the acceptor substance to the substance having a high hole-transport property is from 0.1:1 to 4.0:1.

Examples of the acceptor substance that is used for the charge generation region include a transition metal oxide and an oxide of a metal belonging to any of Groups 4 to 8 of the periodic table. Specifically, molybdenum oxide is particularly preferable. Note that molybdenum oxide has a low hygroscopic property.

As the substance having a high hole-transport property that is used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. Note that any substance other than the above substances may be used as long as the hole-transport property thereof is higher than the electron-transport property thereof.

<<Electron-Relay Layer>>

The electron-relay layer 1104b is a layer that can immediately receive electrons extracted by the acceptor substance in the first charge generation region 1104c. Therefore, the electron-relay layer 1104b is a layer containing a substance having a high electron-transport property, and the LUMO level of the electron-relay layer 1104b is positioned between the acceptor level of the acceptor substance in the first charge generation region 1104c and the LUMO level of the light-emitting unit 1103 with which the electron-relay layer is in contact. Specifically, the LUMO level of the electron-relay layer 1104b is preferably approximately greater than or equal to −5.0 eV and less than or equal to −3.0 eV.

Examples of the substance used for the electron-relay layer 1104b include a perylene derivative (e.g., 3,4,9,10-perylenetetracarboxylic dianhydride (abbreviation: PTCDA)) and a nitrogen-containing condensed aromatic compound (e.g., pyrazino[2,3-f][1,10]phenanthroline-2,3-dicarbonitrile (abbreviation: PPDN)).

Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used, in which case electrons can be received more easily in the electron-relay layer 1104b.

<<Electron-Injection Buffer>>

An electron-injection buffer is a layer containing a substance having a high electron-injection property. The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be lowered.

Examples of the substance having a high electron-injection property include an alkali metal, an alkaline earth metal, a rare earth metal, and a compound of these metals.

Alternatively, the layer containing a substance having a high electron-injection property may be a layer containing a substance having a high electron-transport property and a donor substance.

<Method for Manufacturing Light-Emitting Element>

A method for manufacturing the light-emitting element is described. Over the lower electrode, the layers described above are combined as appropriate to form the EL layer. Any of a variety of methods (e.g., a dry process or a wet process) can be used for the EL layer depending on the material for the EL layer. For example, a vacuum evaporation method, a transfer method, a printing method, an inkjet method, a spin coating method, or the like may be selected. Note that a different formation method may be employed for each layer. The upper electrode is formed over the EL layer. In the above manner, the light-emitting element is manufactured.

The light-emitting element described in this embodiment can be manufactured by combining the above materials. Light emission from the above light-emitting substance can be obtained with this light-emitting element, and the emission color can be selected by changing the types of the light-emitting substances.

When a plurality of light-emitting substances emitting light of different colors are used, the width of the emission spectrum can be expanded, whereby, for example, white light emission can be obtained. In order to obtain white light emission, for example, a structure may be employed in which at least two layers containing light-emitting substances are provided so that light of complementary colors is emitted. Specific examples of complementary colors are a combination of blue and yellow and a combination of blue-green and red.

Furthermore, in order to obtain white light emission with an excellent color rendering property, an emission spectrum preferably spreads through the entire visible light region. For example, a light-emitting element may include layers emitting light of blue, green, and red.

This embodiment can be combined with any of the other embodiments in this specification as appropriate.

Embodiment 4

In this embodiment, electronic devices in each of which a light-emitting device or a light-emitting panel of one embodiment of the present invention is used will be described with reference to FIGS. 6A to 6F.

The electronic devices of one embodiment of the present invention each include a display portion including a light-emitting panel of one embodiment of the present invention and can display an image on the display portion. For example, video data broadcasted or distributed or video data stored in a data storage medium can be displayed. In addition, data processed by a data processing device can be displayed. In addition, an image used for operation of a control panel or the like can be displayed.

Examples of the electronic device displaying video data include a television device and a digital photo frame.

Examples of the data processing device include a computer, a digital camera, a digital video camera, and a portable information terminal.

Examples of the electronic device include a watch, a mobile phone, a portable game machine, a large-scale game machine (e.g., a pachinko machine), and an audio reproducing device.

<Television Device>

Figure 6A:
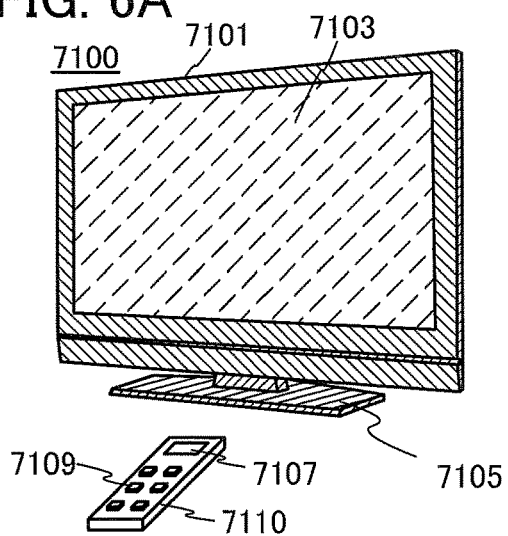
FIGS. 6A to 6F each illustrate an electronic device according to an embodiment.

A television device 7100 includes a display portion 7103 incorporated in a housing 7101 supported by a stand 7105 (see FIG. 6A). In addition, the television device 7100 includes the display portion 7103 including the light-emitting panel of one embodiment of the present invention and can display an image.

A remote controller 7110 can control the television device 7100. With the remote controller 7110, for example, video data displayed on the display portion 7103 can be switched, and volume can be adjusted.

The remote controller 7110 includes a data input and output panel 7107, an operation key 7109, and the like.

The display portion 7103 can display a broadcast program received by a receiver or an image supplied from a modem.

The television device 7100 may be connected to the Internet to perform two-way (e.g., between a sender and a receiver or between receivers) communication of data.

<Data Processing Device>

Figure 6B:
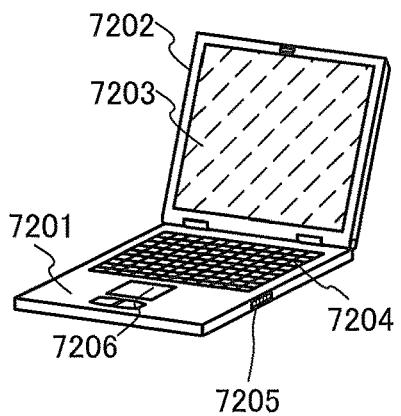

FIG. 6B illustrates a computer as an example of a data processing device. The computer includes a main body 7201, a housing 7202, a display portion 7203, a keyboard 7204, an external connection port 7205, a pointing device 7206, and the like. The display portion 7203 in the computer, which includes the light-emitting panel of one embodiment of the present invention, can display images.

<Game Machine>

Figure 6C:
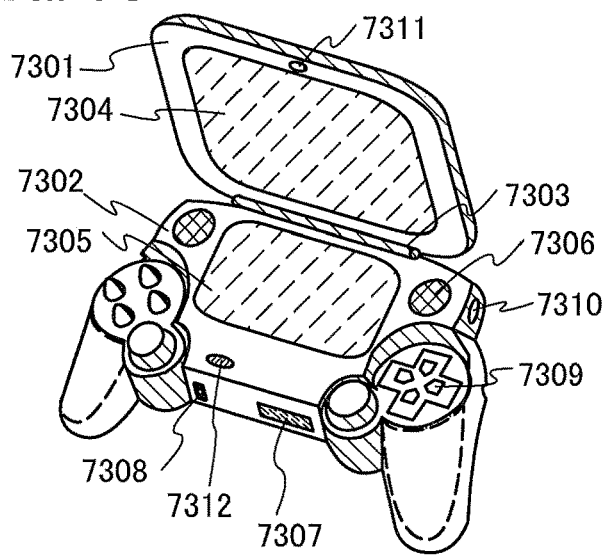

FIG. 6C illustrates an example of a portable game machine. A portable game machine illustrated as an example includes two housings, a housing 7301 and a housing 7302, which are jointed with a joint portion 7303 so that the portable game machine can be opened or folded. A first display portion 7304 is incorporated in the housing 7301 and a second display portion 7305 is incorporated in the housing 7302. The first display portion 7304 and the second display portion 7305 in the portable game machine, which include the light-emitting panel of one embodiment of the present invention, can display images.

In addition, the portable game machine includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light such as infrared light, liquid, magnetism, temperature, chemical substance, sound, time, hardness, electric field, current, voltage, electric power, radiation, flow rate, humidity, gradient, oscillation, or odor), or a microphone 7312), and the like.

The portable game machine has a function of reading a program or data stored in a recording medium to display it on the first display portion 7304 and the second display portion 7305, and a function of sharing information with another portable game machine by wireless communication.

<Mobile Phone>

Figure 6D:
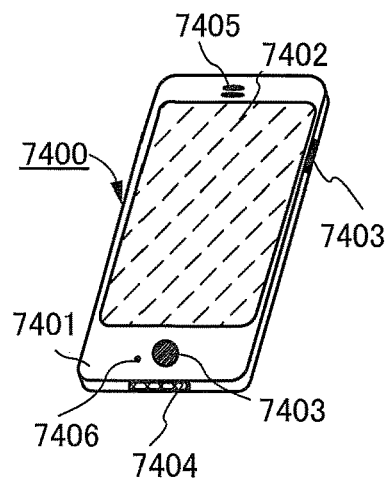

FIG. 6D illustrates an example of a mobile phone. A mobile phone 7400 is provided with a display portion 7402 incorporated in a housing 7401, an operation button 7403, an external connection port 7404, a speaker 7405, a microphone 7406, and the like. The display portion 7402 in the mobile phone 7400, which includes the light-emitting panel of one embodiment of the present invention, can display images.

The display portion 7402 includes a proximity sensor. Data can be input when a finger or the like touches or approaches the proximity sensor.

When a detection device including a sensor such as a gyroscope or an acceleration sensor for detecting inclination is provided, display on the screen of the display portion 7402 can be automatically changed in direction by determining the orientation of the mobile phone 7400 (whether the mobile phone 7400 is placed horizontally or vertically for a landscape mode or a portrait mode).

The display portion 7402 can function as a two-dimensional image sensor. In that case, images of a palm print and a fingerprint of a hand which touches the display portion 7402, images of a palm vein and a finger vein which can be taken using a backlight or a sensing light source emitting near-infrared light, and the like can be used for personal authentication, for example.

<Portable Information Terminal>

Figure 6E:
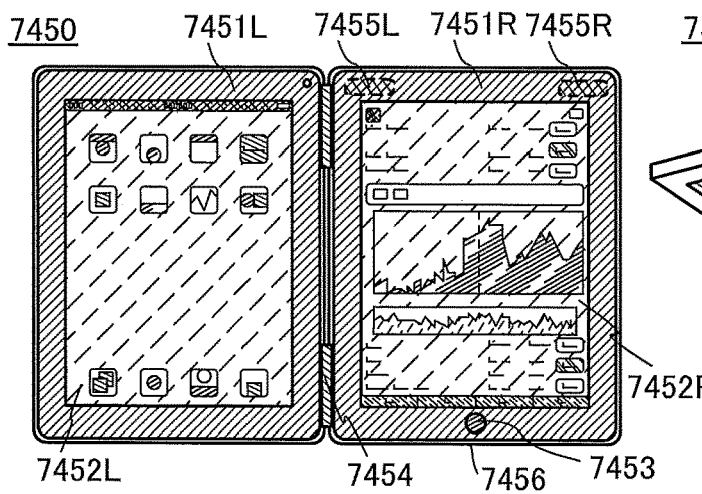

FIG. 6E illustrates an example of a foldable portable information terminal. A portable information terminal 7450 includes a housing 7451L and a housing 7451R connected by hinges 7454. The portable information terminal 7450 further includes an operation button 7453, a left speaker 7455L, and a right speaker 7455R. In addition, a side surface of the portable information terminal 7450 is provided with an external connection port 7456, which is not illustrated. Note that when the portable information terminal 7450 is folded on the hinges 7454 so that a display portion 7452L provided in the housing 7451L and a display portion 7452R provided in the housing 7451R can face each other, the display portions can be protected by the housings. The display portion 7452L and the display portion 7452R in the portable information terminal 7450, which include the light-emitting panel of one embodiment of the present invention, can display images.

The portable information terminal 7450 can also include a gyroscope, an acceleration sensor, a global positioning system (GPS) receiver, or a video camera. For example, when a detection device including a sensor for detecting inclination, such as a gyroscope or an acceleration sensor, is provided, the orientation of the display screen can be automatically changed by determining the orientation of the portable information terminal 7450 (whether the portable information terminal 7450 is placed horizontally or vertically for a landscape mode or a portrait mode).

Furthermore, the portable information terminal 7450 can be connected to a network. The portable information terminal 7450 not only can display data on the Internet but also can be used as a terminal controlling another electronic device connected to the network from a distant place.

<Lighting Device>

Figure 6F:
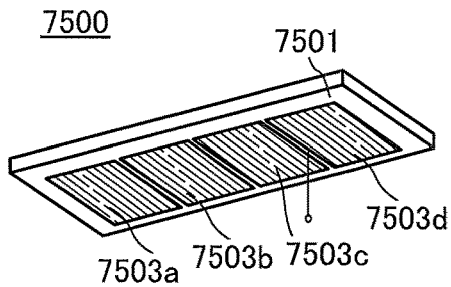

FIG. 6F is an example of a lighting device. A lighting device 7500 includes light-emitting devices 7503a, 7503b, 7503c, and 7503d incorporated in a housing 7501. The lighting device 7500 can be attached to a ceiling, a wall, or the like. The light-emitting devices included in the lighting device 7500 are each the light-emitting device of one embodiment of the present invention.

This embodiment can be combined with any of the other embodiments in this specification as appropriate.

Example 1

In this example, an absorption layer that can be used in a light-emitting device, a light-emitting panel, or a display panel is described with reference to FIGS. 7A and 7B, FIGS. 8A to 8C, and FIGS. 9A1, 9A2, 9A3, and 9B.

Figure 7A:
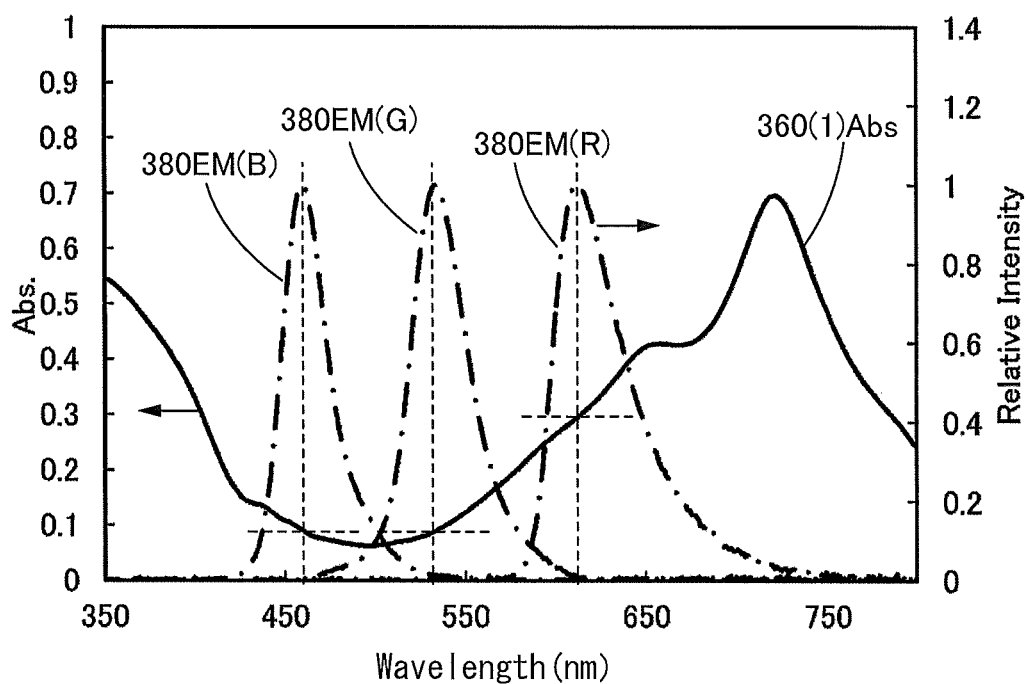
FIGS. 7A and 7B each show an absorption spectrum of an absorption layer and emission spectra of light-emitting modules according to an example.
Figure 7B:
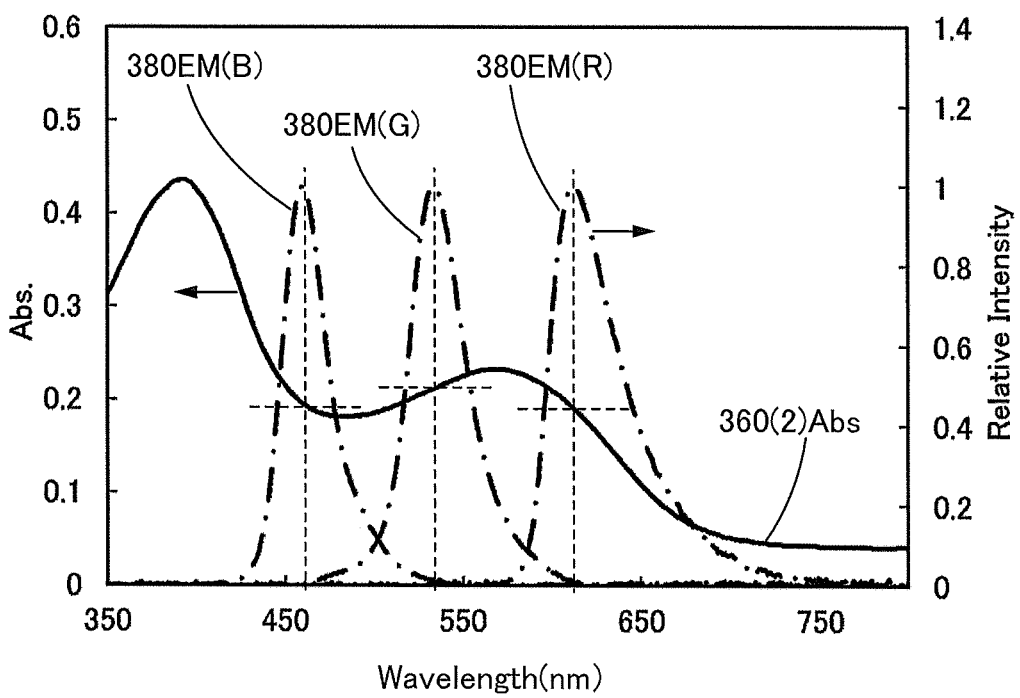

FIGS. 7A and 7B show absorption spectra of absorption layers that can be used in a light-emitting device, a light-emitting panel, or a display panel of one embodiment of the present invention, and emission spectra of light-emitting modules. Note that the absorption spectra of the absorption layers were measured with a spectrophotometer (U-4100, manufactured by Hitachi High-Technologies Corporation). The emission spectra of the light-emitting modules were measured with a spectroradiometer (manufactured by USHIO INC.).

Specifically, FIG. 7A shows an absorption spectrum 360(1)Abs of an absorption layer 360(1) and emission spectra 380EM(R), 380EM(G), and 380EM(B).

Specifically, FIG. 7B shows an absorption spectrum 360(2)Abs of an absorption layer 360(2) and the emission spectra 380EM(R), 380EM(G), and 380EM(B).

The emission spectrum 380EM(R) has a peak wavelength of 611 nm and a half width of 45 nm. The emission spectrum 380EM(G) has a peak wavelength of 533 nm and a half width of 36 nm. The emission spectrum 380EM(B) has a peak wavelength of 460 nm and a half width of 29 nm.

Note that a structure of a display panel including a light-emitting module that emits light with the emission spectrum 380EM(R), a light-emitting module that emits light with the emission spectrum 380EM(G), and a light-emitting module that emits light with the emission spectrum 380EM(B) will be described in detail in Example 2.

Figure 8A:
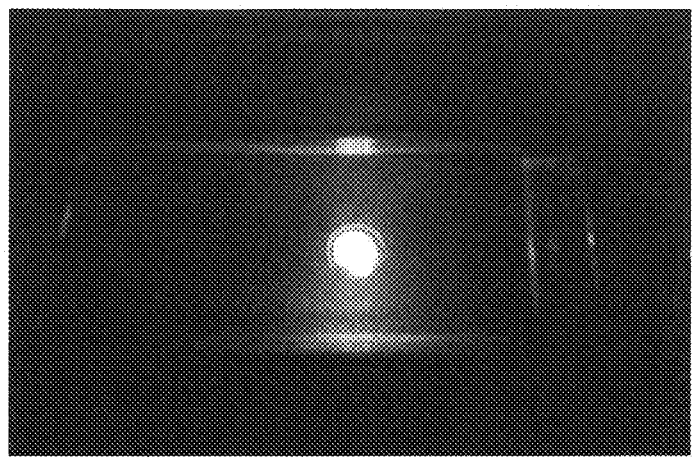
FIGS. 8A to 8C are photographs each showing light reflected by a display panel according to an example.
Figure 8B:
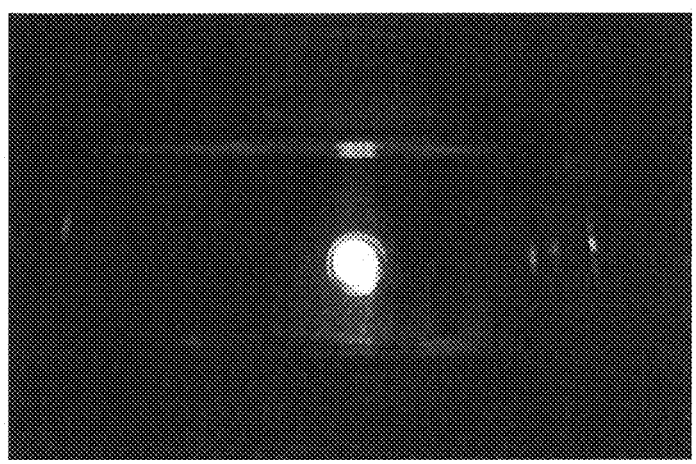
Figure 8C:
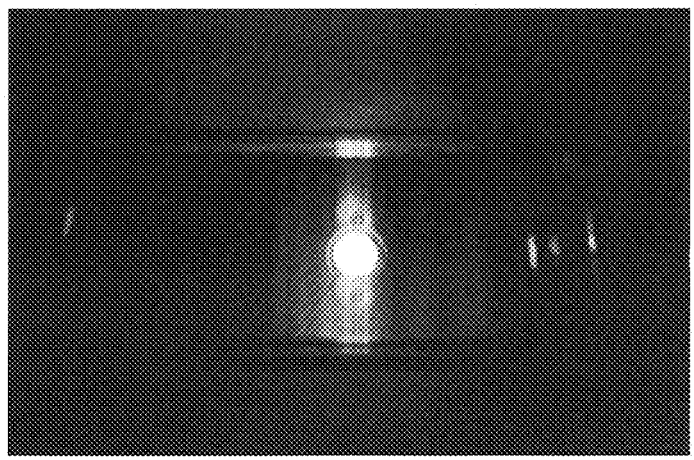

FIGS. 8A to 8C show light that is reflected by display panels overlapped with the absorption layers described in this example and light that is reflected by a display panel not overlapped with an absorption layer.

Specifically, FIG. 8A is a photograph of light that is reflected by a display panel overlapped with the absorption layer 360(1), taken with a digital camera. FIG. 8B is a photograph of light that is reflected by a display panel overlapped with the absorption layer 360(2). FIG. 8C is a photograph of light that is reflected by a display panel not overlapped with an absorption layer.

FIGS. 9A1, 9A2, 9A3, and 9B show a method for forming an absorption layer and a method for evaluating reflection of external light, which are described in this example.

Specifically, FIGS. 9A1 to 9A3 illustrate a method for forming an absorption layer 360 that can be used in a display panel of one embodiment of the present invention. FIG. 9 B illustrates a method for measuring the effect of the absorption layer 360 reducing undesired reflection.

Structures of the absorption layer 360(1) and the absorption layer 360(2) formed in this example are described below. Compositions of the absorption layer 360(1) and the absorption layer 360(2) are detailed in Table 1.

The absorption layer 360(2) absorbed part of light with wavelengths shorter than 611 nm more easily than light with the wavelength 611 nm (see FIG. 7B).

The absorption layer 360(2) absorbed part of light with wavelengths longer than 533 nm and part of light with wavelengths shorter than 533 nm more easily than light with the wavelength 533 nm.

The absorption layer 360(2) absorbed part of light with wavelengths longer than 460 nm and part of light with wavelengths shorter than 460 nm more easily than light with the wavelength 460 nm.

The absorption layer 360(2) absorbed part of light with wavelengths between 533 nm and 611 nm more easily than light with the wavelength 611 nm and light with the wavelength 533 nm. Further, the absorption layer 360(2) absorbed part of light with wavelengths between 460 nm and 611 nm more easily than light with the wavelength 611 nm and light with the wavelength 460 nm.

The display panel overlapped with the absorption layer 360(2) did not reflect external light easily as compared with the display panel not overlapped with an absorption layer.

TABLE 1

| Composition | Product | Absorption layer 360(1) | | Absorption layer 360(2) | |
| --- | --- | --- | --- | --- | --- |
| | | Addition (mg) | Proportion (wt %) | Addition (mg) | Proportion (wt %) |
| Dye | RPC-122 (YAMADA CHEMICAL CO., LTD.) | 30.7 | 9.08 | N/A | N/A |
| | G207 (Hayashibara Co., Ltd.) | N/A | N/A | 1.2 | 0.29 |
| | G241 (Hayashibara Co., Ltd.) | N/A | N/A | 1.8 | 0.44 |
| Adhesive | R-2007 (ALTECO INC.) | 200.8 | 59.37 | 263.4 | 64.31 |
| | H-1010 (ALTECO INC.) | 106.7 | 31.55 | 143.2 | 34.96 |
| | Sum | 338.2 | 100 | 409.6 | 100 |

<Absorption Layer 360(1)>

The absorption layer 360(1) includes a dye (RPC-122, produced by YAMADA CHEMICAL CO., LTD.) and a two-component type epoxy adhesive (R2007/H-1010, produced by ALTECO INC.).

The absorption layer 360(1) absorbed part of light with wavelengths longer than 611 nm more easily than light with the wavelength 611 nm. Further, the absorption layer 360(1) absorbed part of light with wavelengths shorter than 611 nm more easily than light with the wavelength 611 nm (see FIG. 7A).

The absorption layer 360(1) absorbed part of light with wavelengths longer than 533 nm and part of light with wavelengths shorter than 533 nm more easily than light with the wavelength 533 nm.

The absorption layer 360(1) absorbed part of light with wavelengths longer than 460 nm and part of light with wavelengths shorter than 460 nm more easily than light with the wavelength 460 nm.

The display panel overlapped with the absorption layer 360(1) did not reflect external light easily as compared with the display panel not overlapped with an absorption layer. Specifically, the intensity of light reflected by sub-pixels regularly arranged in the display panel was reduced, and a pattern of interference fringes was less likely to be perceived (see FIG. 8A) than in the display panel not overlapped with an absorption layer (see FIG. 8C).

<Absorption Layer 360(2)>

The absorption layer 360(2) includes dyes (G207 and G241, produced by Hayashibara Co., Ltd.) and a two-component type epoxy adhesive (R2007/H-1010, produced by ALTECO INC.).

Specifically, the intensity of light reflected by sub-pixels regularly arranged in the display panel was reduced, and a pattern of interference fringes was less likely to be perceived (see FIG. 8B) than in the display panel not overlapped with an absorption layer (see FIG. 8C).

<Method for Forming Absorption Layer>

A method for forming the absorption layer in this example is described below with reference to FIGS. 9A1 to 9A3.

In step 1, spacers with a diameter of 4 μm were scattered over a 0.7-mm-thick non-alkali glass substrate 310.

In step 2, a UV curable sealant 355 (XNR-5516Z, produced by Nagase Chemtex Corporation) was applied to form a closed curve (see FIG. 9A1).

In step 3, a material of an uncured absorption layer was dripped into a region surrounded by the sealant 355 (see FIG. 9A2).

In step 4, the uncured absorption layer was sandwiched between the glass substrate 310 and a non-alkali glass substrate 370, and the two substrates were pressed against each other with a pressure of 0.1 MPa for two minutes (see FIG. 9A3).

In step 5, the sealant was irradiated with ultraviolet light to be cured. Note that a light-blocking mask was used to protect the absorption layer from the ultraviolet light.

In step 6, the absorption layer 360 including the two-component type epoxy adhesive was let to cure for one day.

<Method for Evaluating External Light Reflection>

A method for evaluating reflection of external light by a display panel is described with reference to FIG. 9B.

A display panel overlapped with an absorption layer was prepared as a sample. The sample was irradiated with light at an angle of approximately 45° to the surface of the sample. In addition, a display panel not overlapped with an absorption layer was prepared as a comparative sample.

A photograph of external light reflected by the sample was taken with a digital camera at an angle of approximately 45° to the surface of the sample.

Note that a mini halogen lamp (MULTILAYER HE/DI-COOL S-MIRROR (registered trademark), produced by Panasonic Corporation) was used as a light source.

<Evaluation Results>

The display panel in this example includes an absorption layer capable of absorbing light reflected by conductive films that are electrically connected to light-emitting modules arranged with high spatial frequency. This structure not only enables display of excellent high-resolution images but also makes interference between light reflected by the conductive films unlikely to occur. With this structure, a novel display panel in which undesired light generated by interference (e.g., a pattern of interference fringes) is reduced was able to be provided. Since the absorption layer absorbed light corresponding to excess parts of the spectra of light emitted by the light-emitting modules, the color reproducibility of the display panel was improved. Specifically, the NTSC ratio of the display panel using the absorption layer 360(1) was improved from 102% to 105%.

Example 2

In this example, a display panel that can be overlapped with the absorption layer described in Example 1 is described with reference to FIG. 4 and FIG. 10.

Figure 10:
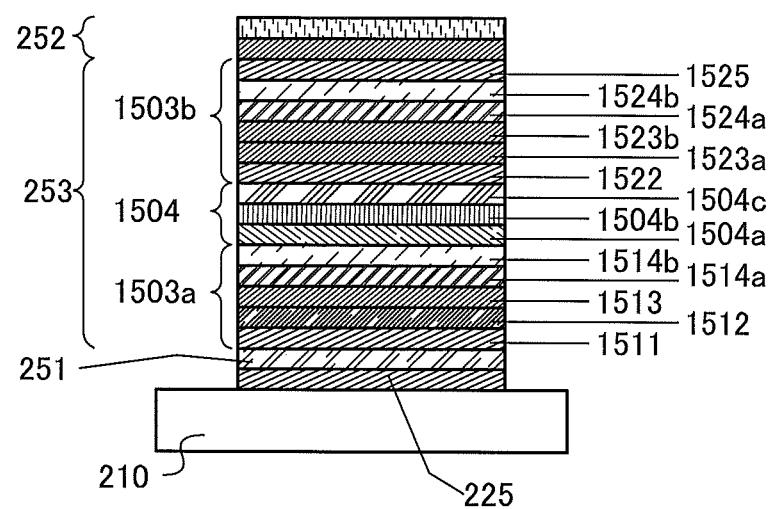
FIG. 10 illustrates a structure of a light-emitting element according to an example.

FIG. 10 is a schematic view of a structure of a light-emitting element included in the display panel described in this example.

In this example, a display panel in which the pixels 202A described in the modification example of Embodiment 2 are provided with a resolution of 326 ppi was fabricated. The display panel fabricated in this example differs from the display panel described in the modification example of Embodiment 2 in that the substrate 210 and the counter substrate 270 are attached to each other with a sealant surrounding the display region 201 and a space between a light-emitting element (e.g., the first light-emitting element 250R) and the counter substrate 270 is filled with a dried nitrogen gas. Note that the absorption layer described in Example 1 was used as the absorption layer 260A.

<Structure of Light-Emitting Element>

A light-emitting element (e.g., the light-emitting element 250R) includes a lower electrode (e.g., the lower electrode 251R), the upper electrode 252, the two light-emitting units (253a and 253b) between the lower electrode and the upper electrode, and the intermediate layer 254 between the light-emitting units.

The light-emitting element includes a lower electrode 251, the upper electrode 252, and the layer 253 containing a light-emitting organic compound between the lower electrode 251 and the upper electrode 252 (see FIG. 10). The lower electrode 251 is provided over a reflective conductive film 225 over the substrate 210.

Note that a semi-transmissive and semi-reflective film was used as the upper electrode 252 and the lower electrode 251 stacked on the reflective conductive film 225 was used to form a microresonator.

<<Structure of Lower Electrode>>

The reflective conductive film 225 had a structure in which a 5-nm-thick or an 8-nm-thick titanium film is stacked on a 200-nm-thick aluminum film. Note that the reflective conductive film 225 also serves as a wiring for supplying power to the lower electrode 251. As the lower electrode 251, an indium-tin oxide film containing silicon oxide (an "ITSO film") was used.

Note that the ITSO film also serves as an optical adjustment layer. The thickness of the optical adjustment layer was optimized for each emission color. Specifically, a light-emitting module for emitting red light was provided with an 85-nm-thick ITSO film, a light-emitting module for emitting green light was provided with a 45-nm-thick ITSO film, and a light-emitting module for emitting blue light was provided with a 5-nm-thick ITSO film.

<<Structure of Upper Electrode>>

As the upper electrode 252, a film in which 70-nm-thick indium tin oxide (abbreviation: ITO) was stacked on a 15-nm-thick silver-magnesium alloy film was used. The silver-magnesium alloy film was formed by co-evaporation with a weight ratio of 10:1 (=Ag:Mg).

<<Structure of Layer Containing Light-Emitting Organic Compound>>

The layer 253 containing a light-emitting organic compound had a structure in which two EL layers (a first EL layer 1503a and a second EL layer 1503b) were provided with an intermediate layer 1504 interposed therebetween. This structure is referred to as a tandem structure.

The first EL layer 1503a was formed by depositing a hole-injection layer 1511, a first hole-transport layer 1512, a first light-emitting layer 1513, a first electron-transport layer 1514a, and a second electron-transport layer 1514b in this order over the lower electrode 251.

The intermediate layer 1504 was formed by depositing an electron-injection buffer layer 1504a, an electron-relay layer 1504b, and a charge generation region 1504c in this order over the electron-transport layer 1514b.

The second EL layer 1503b was formed by depositing a second hole-transport layer 1522, a second light-emitting layer 1523a, a third light-emitting layer 1523b, a third electron-transport layer 1524a, a fourth electron-transport layer 1524b, and an electron-injection layer 1525 in this order over the intermediate layer 1504.

Table 2 shows details of materials used for the layer containing a light-emitting organic compound. Note that the thickness of the hole-transport layer 1512 was varied depending on the structure of the lower electrode. Specifically, when the lower electrode had a structure in which a 5-nm-thick titanium film was stacked on a 200-nm-thick aluminum film, the thickness of the hole-transport layer 1512 was 13 nm; when the lower electrode had a structure in which an 8-nm-thick titanium film was stacked on a 200-nm-thick aluminum film, the thickness of the hole-transport layer 1512 was 10 nm.

TABLE 2

| | First EL layer 1503a | | | | | Intermediate layer 1504 | | |
|---|---|---|---|---|---|---|---|---|
| | Hole-injection layer | Hole-transport layer | Light-emitting layer | Electron-tranport layer | | Electron-injection buffer layer | Electron-relay layer | Charge generation region |
| | 1511 | 1512 | 1513 | 1514a | 1514b | 1504a | 1504b | 1504c |
| EL layer | PCzPA: MoOx (= 2:1) 13 nm | PCzPA Ti(8):10 nm Ti(5):13 nm | CzPA:1,6-mMe mFLPAPrn (= 1:0.05) 30 nm | CzPA 5 nm | BPhen 15 nm | Li 0.1 nm | CuPc 2 nm | BPAFLP: MoOx (= 2:1) 13 nm |

| | Second EL layer 1503b | | | | | |
|---|---|---|---|---|---|---|
| | Hole-transport layer | Light-emitting layer | | Electron-transport layer | | Election-injection layer |
| | 1522 | 1523a | 1523b | 1524a | 1524b | 1525 |
| EL layer | BPAFLP 20 nm | 2mDBTPDBqII: PCBA1BP:Ir (tBppm)₂acac (= 0.8:0.2:0.06) 20 nm | 2mDBTPDBqII: Ir(tppr)₂dpm (= 1:0.02) 20 nm | 2mDBTPDBqII 15 nm | BPhen 15 nm | LiF 1 nm |

※MoOx is molybdenum oxide

Structural formulas of part of the organic compounds used in this example are shown below.

[Chemical Formula 1]

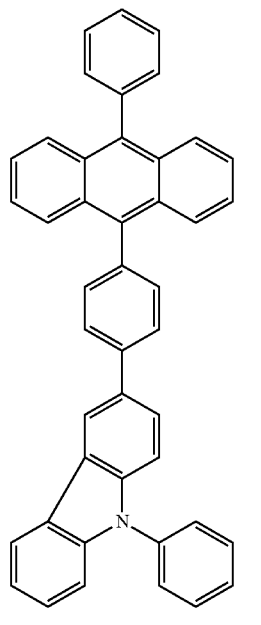

PCzPA

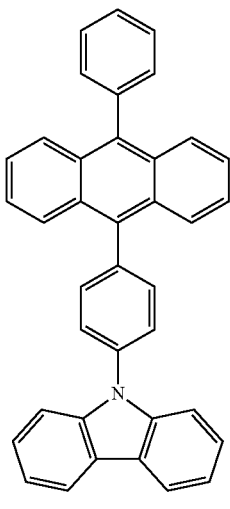

CzPA

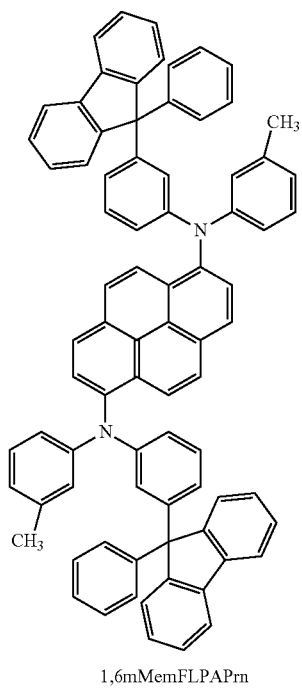

1,6mMemFLPAPrn

-continued

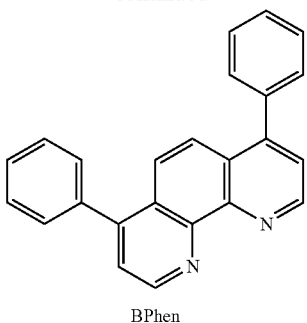

BPhen

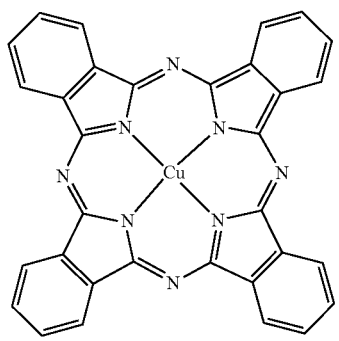

CuPc

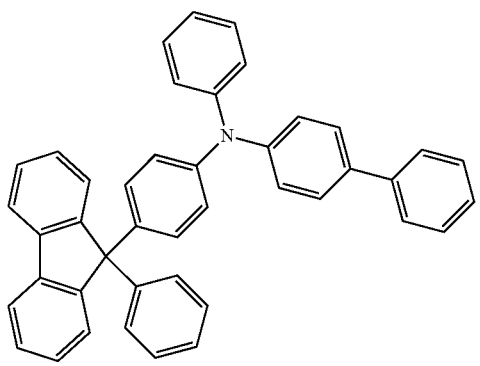

BPAFLP

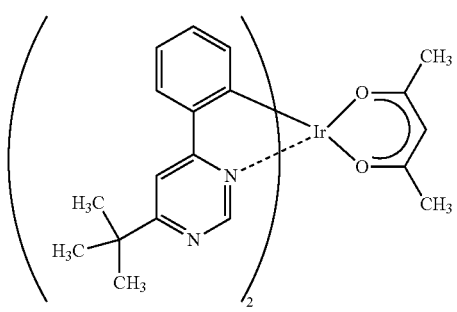

[Ir(tBuppm)₂(acac)]

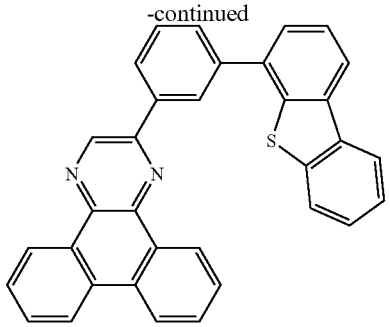

2mDBTPDBq-II

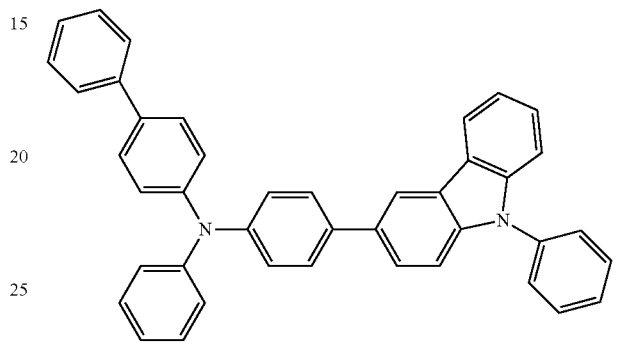

PCBA1BP

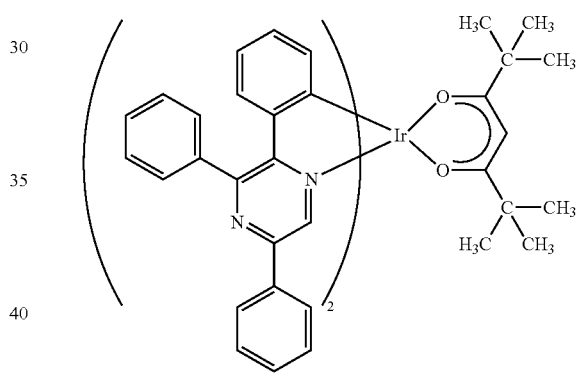

[Ir(tppr)₂(dpm)]

This application is based on Japanese Patent Application serial no. 2013-100023 filed with Japan Patent Office on May 10, 2013, the entire contents of which are hereby incorporated by reference.

What is claimed is:

1. A light-emitting panel comprising:
    an absorption layer comprising a first portion, a second portion, a third portion, a fourth portion and a fifth portion;
    a first conductive film;
    a second conductive film;
    a third conductive film;
    a first light-emitting module electrically connected to the first conductive film;
    a second light-emitting module electrically connected to the second conductive film;
    a third light-emitting module electrically connected to the third conductive film; and
    a substrate over the first conductive film, the second conductive film, the first light-emitting module, and the second light-emitting module, wherein the first light-emitting module and the second light-emitting module are arranged with a first gap therebetween,
wherein the second light-emitting module and the third light-emitting module are arranged with a second gap therebetween,
wherein the first portion and the first conductive film overlap with each other,
wherein the second portion and the second conductive film overlap with each other,
wherein the third portion and the third conductive film overlap with each other,
wherein the fourth portion and the first gap overlap with each other,
wherein the fifth portion and the second gap overlap with each other,
wherein the first portion, the second portion and the third portion have the same absorption spectrum,
wherein the absorption spectrum of the absorption layer has two maximal peaks,
wherein each absorption peak typified by the two maximal peaks exhibits having an absorption at a visible light wavelength,
wherein the first conductive film and the second conductive film reflect visible light,
wherein the first light-emitting module is arranged to emit, toward the absorption layer, a first light with a spectrum having a peak at a first wavelength in a visible light region,
wherein the second light-emitting module is arranged to emit, toward the absorption layer, a second light with a spectrum having a peak at a second wavelength that is longer thanthe first wavelength in the visible light region,
wherein the third light-emitting module is arranged to emit, toward the absorption layer, a third light with a spectrum having a peak at a third wavelength that is longer than the second wavelength in the visible light region,
wherein the two maximal peaks in the absorption spectrum of the absorption layer has a fourth wavelength and a fifth wavelength,
wherein the fourth wavelength is shorter than the first wavelength,
wherein the fifth wavelength is longer than the second wavelength and shorter than the third wavelength,
wherein the absorption, layer is the outermost layer, and
wherein the absorption layer is in contact with the substrate, the first light-emitting module, and the second light-emitting module.

2. The light-emitting panel according to claim 1, wherein the absorption layer comprises one of a metal complex dye and an organic dye.

3. The light-emitting panel according to claim 1, wherein the absorption layer comprises an adhesive.

4. The light-emitting panel according to claim 3, wherein the adhesive comprises a resin.

5. The light-emitting panel according to claim 1, wherein the absorption layer has maximal values of an absorbance at the third wavelength and the fifth wavelength.

6. A display panel comprising:
an absorption layer comprising, a first portion, a second portion, a third portion, a fourth portion and a fifth portion;
a first conductive film;
a second conductive film;
a third conductive film;
a first light-emitting module electrically connected to the first conductive film;
a second light-emitting module electrically connected to the second conductive film;
a third light-emitting module electrically connected to the third conductive film; and
a substrate over the first conductive film, the second conductive film, the third conductive film, the first light-emitting module, the second light-emitting module, and the third light-emitting module,
wherein the first light-emitting module and the second light-emitting module are arranged with a first gap between the first light-emitting module and the second light-emitting module,
wherein the second light-emitting module and the third light-emitting module are arranged with a second gap between the second light-emitting module and the third light-emitting module,
wherein the first portion and the first conductive film overlap with each other,
wherein the second portion and the second conductive film overlap with each other,
wherein the third portion and the first gap overlap with each other,
wherein the fourth portion and the third conductive film overlap with each other,
wherein the fifth portion and the second gap overlap with each other,
wherein the first portion, the second portion, the third portion, the fourth portion and the fifth portion have the same absorption spectrum,
wherein the absorption spectrum of the absorption layer has two maximal peaks,
wherein each absorption peak typified by the two maximal peaks exhibits having an absorption at a visible light wavelength,
wherein the first light-emitting module is arranged to emit, toward the absorption, layer, a first light with a spectrum having a peak at a first wavelength in a visible light region,
wherein the second light-emitting module is arranged to emit, toward the absorption layer, a second light with a spectrum having a peak at a second, wavelength that is longer than the first wavelength in the visible light region,
wherein the third light-emitting module is arranged to emit, toward the absorption layer, a third light with a spectrum having a peak at a third wavelength that is longer than the second wavelength in the visible light region,
wherein the two maximal peaks in the absorption spectrum of the absorption layer has a fourth wavelength and a fifth wavelength,
wherein the fourth wavelength is shorter than the first wavelength,
wherein the fifth wavelength is positioned between the second wavelength and the third wavelength,
wherein the absorption layer is the outermost layer, and
wherein the absorption layer is in contact with the substrate, the first light-emitting module, the second light-emitting module, and the third light-emitting module.

7. The display panel according to claim 6,
wherein a full width at half maximum of the spectrum having a peak at the first wavelength is greater than or equal to 15 nm and less than or equal to 35 nm, and wherein a full width at half maximum of the spectrum having a peak at the second wavelength is greater than or equal to 15 nm and less than or equal to 95 nm.

8. The display panel according to claim 6, wherein the first light-emitting module and the second light-emitting module each include a microresonator structure.

9. The display panel according to claim 6,
wherein a pixel comprises sub-pixels, at least one of the sub-pixels comprising the first conductive film and the first light-emitting module electrically connected to the first conductive film, and
wherein the pixel has a resolution of greater than or equal to 200 ppi and less than or equal to 1000 ppi.

10. The display panel according to claim 6, wherein the absorption layer has a refractive index of greater than or equal to 1.4 and less than or equal to 2.0.

11. The display panel according to claim 6, wherein the absorption layer comprises one of a metal complex dye and an organic dye.

12. The display panel according to claim 6, wherein the absorption layer comprises an adhesive.

13. The display panel according to claim 12, wherein the adhesive comprises a resin.

14. The light-emitting panel according to claim 1, wherein the substrate comprises a flexible substrate.

15. The display panel according to claim 6, wherein the substrate comprises a flexible substrate.

* * * * *